United States Patent
Hasegawa et al.

(10) Patent No.: US 7,280,184 B2
(45) Date of Patent: Oct. 9, 2007

(54) ASSEMBLY AND ADJUSTING METHOD OF OPTICAL SYSTEM, EXPOSURE APPARATUS HAVING THE OPTICAL SYSTEM

(75) Inventors: Takayuki Hasegawa, Tokyo (JP); Akira Miyake, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 234 days.

(21) Appl. No.: 11/123,975

(22) Filed: May 6, 2005

(65) Prior Publication Data
US 2005/0264779 A1 Dec. 1, 2005

(30) Foreign Application Priority Data
May 7, 2004 (JP) ............... 2004-139062

(51) Int. Cl.
*G03B 27/42* (2006.01)
*G03B 27/32* (2006.01)

(52) U.S. Cl. .......................... 355/53; 355/77

(58) Field of Classification Search ............... 356/520, 356/521; 355/53, 67, 69, 77
See application file for complete search history.

(56) References Cited

U.S. PATENT DOCUMENTS

| | | | |
|---|---|---|---|
| 6,266,389 B1 | 7/2001 | Murayama et al. | |
| 2002/0044287 A1 | 4/2002 | Otaki | |
| 2003/0142322 A1 | 7/2003 | Sato | |
| 2003/0144819 A1 | 7/2003 | Takeuchi et al. | |
| 2003/0215053 A1* | 11/2003 | Ichihara | 378/36 |
| 2004/0075842 A1* | 4/2004 | Dunn et al. | 356/511 |
| 2006/0055940 A1* | 3/2006 | Takeuchi et al. | 356/521 |

FOREIGN PATENT DOCUMENTS

| | | |
|---|---|---|
| EP | 1387220 A2 | 2/2004 |
| EP | 1513023 A1 | 3/2005 |
| EP | 1582908 | 10/2005 |
| JP | 2000-055840 | 2/2000 |
| JP | 2002-243669 | 8/2002 |

OTHER PUBLICATIONS

Underwood, et al. "Layered Synthetic Mircrostructures as Breagg Diffractors for X-Rays and Extreme Ultraviolet: Theory and Predicted Performance", Applied Optics Sep. 1, 1981 vol. 20, No. 17, pp. 3027-3034.

Malinowski, et al. "Cotrolling Contamination in MO/Si Multilayer Mirrors by Si Sureface Capping Modifiations "Proc. SPIE Jul. 2002, pp. 442-453.

* cited by examiner

Primary Examiner—Henry Hung Nguyen
(74) Attorney, Agent, or Firm—Morgan & Finnegan, LLP

(57) ABSTRACT

An adjusting method of an optical system composed plural optical elements each having a multilayer film, said adjusting method that includes a first measuring step that obtains, for each optical element, a difference between a phase distribution of which an EUV light (Extreme Ultraviolet light) is reflected from the optical element and a phase distribution of which a light with a wavelength that is longer than the EUV light is reflected from the optical element, a second measuring step that measures a phase distribution of which the light passes the optical system, a deciding step that decides a phase distribution of which the EUV light passes through the optical system based on the phase distribution difference obtained by the first measuring step and the phase distribution measured by the second measuring step, and an adjusting step that adjusts at least one of a position and a posture of the optical element based on the phase distribution decided by the deciding step.

10 Claims, 21 Drawing Sheets

ASSEMBLY AND ADJUSTING METHOD OF OPTICAL SYSTEM, EXPOSURE APPARATUS HAVING THE OPTICAL SYSTEM

BACKGROUND OF THE INVENTION

The present invention relates generally to an assembly and adjusting method of an optical system, and more particularly to an assembly and adjusting method of a projection composed of a multilayer mirror used for an EUV exposure apparatus.

Reduction projection exposures using ultraviolet have been conventionally employed to manufacture such a fine semiconductor device as a semiconductor memory and a logic circuit in lithography technology. However, the lithography using the ultraviolet light has the limit to satisfy the rapidly promoting fine processing of a semiconductor device. Therefore, an exposure apparatus using extreme ultraviolet ("EUV") light with a wavelength of approximately 13.5 nm shorter than that of the ultraviolet (referred to as an "EUV exposure apparatus" hereinafter) has been developed to efficiently transfer very fine circuit patterns of 50 nm or less.

The EUV exposure apparatus uses a reflection-type optical element such as a mirror for an optical system, and a multilayer film that alternately forms or layers two kinds of materials having different optical constants is formed on a surface of the reflection-type optical element. The multilayer film is formed by alternately forming or layering molybdenum (Mo) layer and silicon (Si) layer on a precisely polished glass plate. The thickness of the layer is decided according to the wavelength of the exposure light etc., and for example, a Mo layer is about 3 nm thickness, and a Si layer is about 4 nm thickness. A sum of thickness of two kinds of materials is generally called a coating cycle, which is 7 nm in the above example.

The multilayer mirror reflects EUV light with a specific wavelength when receiving EUV light. Efficiently reflected EUV light is one within a narrow bandwidth around $\lambda$ that satisfies an interference condition where $\lambda$ is a wavelength of the reflected EUV light, $\theta$ is an incident angle and d is a coating cycle and the bandwidth is about 0.6 to 1 nm. The interference condition is approximately expressible by Bragg's equation (Equation 1), but it shifts minutely from a value obtained from this equation strictly due to refraction in the material etc.

$$2 \times d \times \cos\theta = \lambda \quad (1)$$

On the other hand, the multilayer mirror in the projection optical system requires very high precision for its surface shape. For example, a permissible figure error $\sigma$ (rms value) is given in Marechal's equation (Equation 2) below where n is the number of multilayer mirrors in the projection optical system, and $\lambda$ is a wavelength of the reflected EUV light.

$$\sigma = \frac{\lambda}{28 \times \sqrt{n}} \quad (2)$$

For example, six multilayer mirrors in the projection optical system that uses the exposure light with a wavelength of 13 nm is permitted to have a figure error $\sigma$ of 0.19 nm. The wave front aberration amount is about 0.4 nm (rms value) for resolution of 30 nm pattern transfer, which is permitted for the whole projection optical system.

The projection optical system fabrication method includes a forming process of the multilayer mirror, a shape measuring process, an assembly process to a lens barrel, and an adjusting process of the wave front aberration.

The multilayer mirror forming process polishes the substrate while repeating the shape measurement with the interferometer that uses visible light, and forms a predetermined shape substrate. Next, the multilayer film is formed on the substrate surface. When actually functioning as the optical system, a best thickness distribution is formed in consideration of the angle and the wavelength of the light irradiated to each position of the multilayer film on the mirror surface.

The shape measuring process measures the surface shape of the multilayer mirror that completes the forming the multilayer film by the interferometer that uses visible light, and judges whether the surface shape of the multilayer film satisfies the predetermined shape (in other words, above figure error a). The multilayer mirror judged not to have the predetermined surface shape exfoliates the multilayer because the forming the multilayer film is a failure, and re-forms the multilayer film.

The assembly process to a lens barrel sets the multilayer mirror judged for the shape measuring process to have the predetermined surface shape in the lens barrel, and adjusts an interval and inclination between mirrors. This completes projection optical system.

The adjusting process of the wave front aberration adjusts the wave front aberration of the projection optical system. If a phase change of light by the reflection is a constant value, the wave front of the reflected light reflected from the mirror can be obtained from a wave front of the incident light to the projection optical system and the mirror shape. However, actually, the phase change of the reflected light reflected from the multilayer mirror is different depending on the wavelength of light, the incidence angle, and the film structure. Therefore, even if a geometrical surface shape is measured by visible light, the reflected light surface when the EUV light is irradiated can not be accurately obtained. Then, a method of directly measuring the reflection light surface of the multilayer mirror or the projection optical system by using the EUV light executed limitedly. For example, a point diffraction interferometer (PDI) that generates a spherical wave by a pinhole is known as a means to directly measure the reflected light surface of the multilayer mirror by using EUV light. U.S. Patent Application Publication No. 2002/044287 discloses the PDI.

A method that obtains the layer structure of the X-ray multilayer mirror and the information of interface roughness from the X-ray standing wave spectrum form is known as other prior art. For example, Japanese Patent Application Publication No. 2000-55841 and Japanese Patent Application Publication No. 2002-243669 disclose these techniques.

The model calculation concerning the relationship between the reflectivity of the multilayer film and the phase of the reflected light has been disclosed (see, for example, J. H. Underwood and T. W. Barbee, "Layered Synthetic Microstructures as Bragg Diffractors for X-Rays and Extreme Ultraviolet: Theory and Predicted Performance", Applied Optics 20, 3027 (1981)). Moreover, the photoelectric effect of the multilayer film has been disclosed (see, for example, Michael E. Malinowski, Chip Steinhaus, W. Miles Clift, Leonard E. Klebanoff, Stanley Mrowka, Regina Soufli, "Controlling contamination in Mo/Si multilayer mirrors by Si surface capping modifications", Proc. SPIE Vol. 4688, Page 442-453, July 2002).

However, in PDI method, because a size of the pinhole used to generate an accurate spherical wave is very minute (for example, plural tens nm), and the fabrication of the apparatus is difficult. It is necessary to introduce the EUV light with enough intensity for the minute pinhole. Moreover, PDI method measures the EUV light reflected by all mirrors that compose the optical system. For example, a light intensity of the light that exits from the projection optical system decreases to only 8% of a light intensity of the incident light, where the number of the mirror that composes the projection optical system is six, and the reflectivity is 65%. Therefore, it is necessary to use a high-intensity light source to measure the entire projection optical system, and the measurement system becomes larger and more expensive.

Although the method disclosed in Japanese Patent Application Publication No. 2002-243669 can simply measure the multilayer mirror shape, the wave front of the reflected light can not be obtained if the phase is not considered. Therefore, the wave front of the reflected light can not be correctly obtained, enough in the adjustment of the wave front aberration.

BRIEF SUMMARY OF THE INVENTION

Accordingly, it is an exemplary object of the present invention to provide a highly accurate assembly and adjusting method of an optical system.

An adjusting method of an optical system composed of plural optical elements each having a multilayer film according to one aspect of the present invention includes a first measuring step that obtains, for each optical element, a difference between a phase distribution of which an EUV light is reflected from the optical element and a phase distribution of which a light with a wavelength that is longer than the EUV light is reflected from the optical element, a second measuring step that measures a phase distribution of which the light passes the optical system, a deciding step that decides a phase distribution of which the EUV light passes through the optical system based on the phase distribution difference obtained by the first measuring step and the phase distribution measured by the second measuring step, and an adjusting step that adjusts at least one of a position and a posture of the optical element based on the phase distribution decided by the deciding step.

An adjusting method of an optical system composed plural optical elements each having a multilayer film according to another aspect of the present invention includes a deciding step that decides a phase distribution of which an EUV light passes the optical system based on a difference between a phase distribution when the EUV light is reflected from the optical element and a phase distribution of which a light with a wavelength that is longer than the EUV light is reflected from the optical element, which the difference is obtained for each optical element, and a measurement result of a phase distribution of which the light passes the optical system, and an adjusting step that adjusts at least one of a position and a posture of the optical element based on the phase distribution decided by the deciding step.

An exposure apparatus according to another aspect of the present invention includes a projection optical system for projecting a pattern of a reticle to an object, the projection optical system includes plural optical elements each having a multilayer film, and is adjusted by an adjusting method, wherein the adjusting method includes a first measuring step that obtains, for each optical element, a difference between a phase distribution of which an EUV light is reflected from the optical element and a phase distribution of which a light with a wavelength that is longer than the EUV light is reflected from the optical element, a second measuring step that measures a phase distribution when the light passes the optical system, a deciding step that decides a phase distribution of which the EUV light passes the optical system based on the difference obtained by the first measuring step and the phase distribution measured by the second measuring step; and an adjusting step that adjusts at least one of a position and a posture of the optical element based on the phase distribution decided by the deciding step.

A device fabrication method according to another aspect of the present invention includes the steps of exposing an object using an exposure apparatus, and performing a development process for the object exposed, wherein said exposure apparatus includes a projection optical system for projecting a pattern of a reticle to the object, the projection optical system includes plural optical elements each having a multilayer film, and is adjusted by an adjusting method, wherein the adjusting method includes a first measuring step that obtains, for each optical element, a difference between a phase distribution of which an EUV light is reflected from the optical element and a phase distribution of which a light with a wavelength that is longer than the EUV light is reflected from the optical element, a second measuring step that measures a phase distribution of which the light passes the optical system, a deciding step that decides a phase distribution of which the EUV light passes the optical system based on the difference obtained by the first measuring step and the phase distribution measured by the second measuring step, and an adjusting step that adjusts at least one of a position and a posture of the optical element based on the phase distribution decided by the deciding step.

An exposure apparatus according to another aspect of the present invention includes a projection optical system for projecting a pattern of a reticle to an object, the projection optical system includes plural optical elements each having a multilayer film, and is adjusted by an adjusting method, wherein the adjusting method includes a deciding step that decides a phase distribution of which an EUV light passes the optical system based on a difference between a phase distribution of which the EUV light is reflected from the optical element and a phase distribution when a light with a wavelength that is longer than the EUV light is reflected from the optical element, which the difference is obtained for each optical element, and a measurement result of a phase distribution when the light passes the optical system, an adjusting step that adjusts at least one of a position and a posture of the optical element based on the phase distribution decided by the deciding step.

A device fabrication method according to another aspect of the present invention includes the steps of exposing an object using an exposure apparatus, and performing a development process for the object exposed, wherein said exposure apparatus includes a projection optical system for projecting a pattern of a reticle to the object, the projection optical system includes plural optical elements each having a multilayer film, and is adjusted by an adjusting method, wherein the adjusting method includes a deciding step that decides a phase distribution of which an EUV light passes the optical system based on a difference between a phase distribution of which the EUV light is reflected from the optical element and a phase distribution of which a light with a wavelength that is longer than the EUV light is reflected from the optical element, which difference is obtained for each optical element, and a measurement result of a phase distribution of which the light passes the optical system, an adjusting step that adjusts at least one of a position and a posture of the optical element based on the phase distribution decided by the deciding step.

Other objects and further features of the present invention will become readily apparent from the following description of the preferred embodiments with reference to the accompanying drawings.

DETAILED DESCRIPTION OF THE PREFERRED EMBODIMENTS

A description will now be given of preferred embodiments of the present invention.

Figure 3:
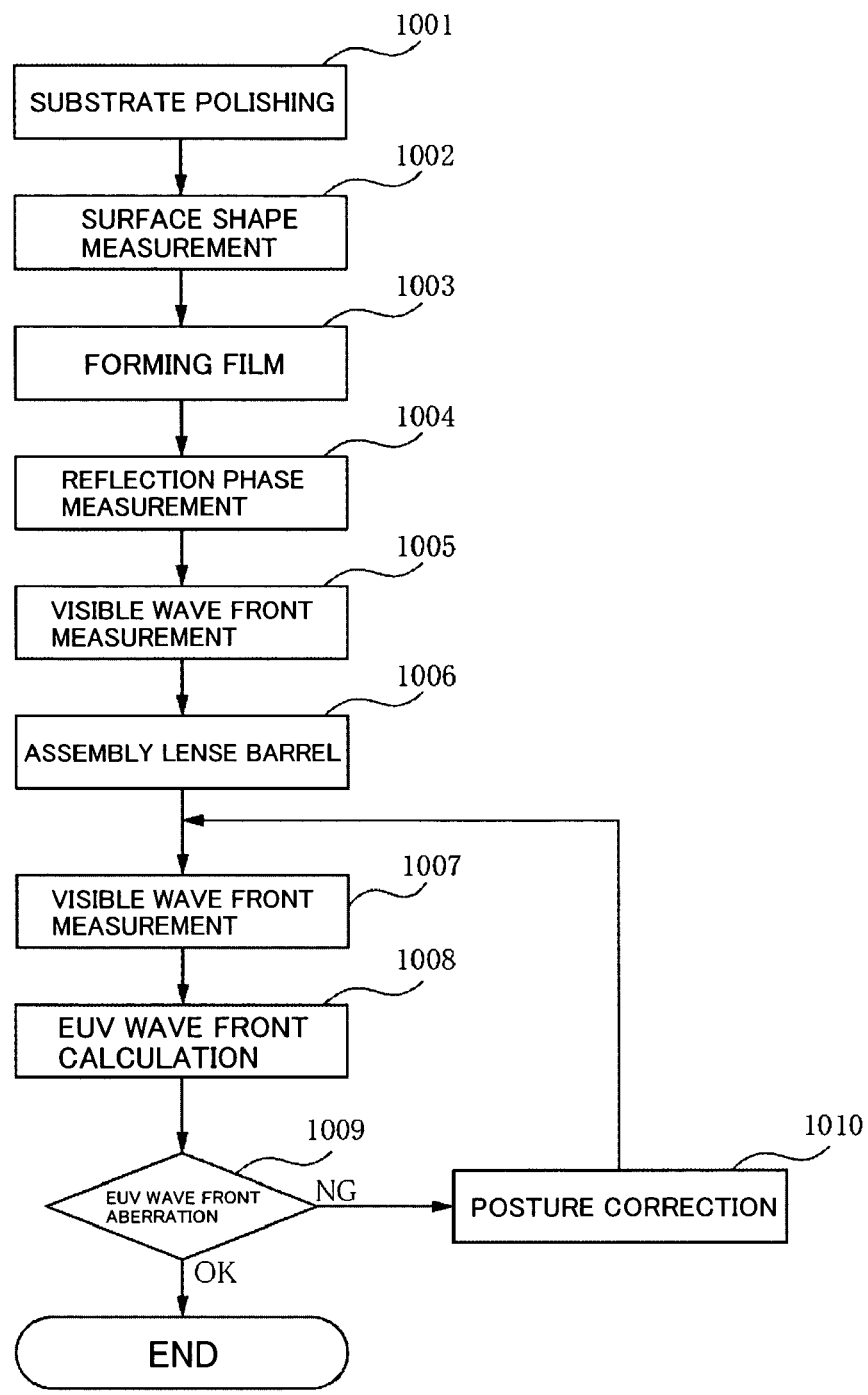
FIG. 3 is a flowchart for explaining an assembly method and adjusting method of an optical system (lens barrel) as one embodiment according to the present invention.

Referring now to FIG. 3, a description will be given of a main part of an assembly method and adjusting method of a lens barrel of the instant embodiment. Here, FIG. 3 is a flowchart of the main part of the assembly method and adjusting method of an optical system of the instant embodiment. The optical system of the instant embodiment is a projection optical system of an EUV exposure apparatus using the EUV light as a light source. The projection optical system is a catoptric system composed of a multilayer mirror that forms a multilayer film on a substrate.

First, a substrate is polished (step 1001). Next, a surface shape is measured by visible light (step 1002). Next, a multilayer film that has a predetermined film thickness on the substrate of predetermined shape is formed (step 1003).

Next, the surface shape of the multilayer film is measured during a reflection position measurement step (step 1004*a*) and a visible wave front measurement step (step 1005*a*). In this case, the conventional shape measuring process measures only a geometrical shape of the multilayer surface. On the other hand, the instant embodiment calculates, as described later, an equivalent shape of the reflection surface based on a phase difference between an incident light and a reflected light in addition to the geometrical shape of the multilayer surface. The phase difference between the incident light and the reflected light is calculated by using a secondary radiation radiated according to the standing wave generated when the EUV light with a wavelength of 2 to 40 nm is irradiated to the multilayer film of optical element (for example, multilayer mirror) that the multilayer film that has the predetermined film thickness on the substrate of predetermined shape is formed, and a shape of "equivalent reflection surface" described later is calculated by using the phase difference. When a difference (error) from a design value of the surface shape of "equivalent reflection surface" or an ideality shape is within a tolerance (for example, above figure error σ), a lens barrel assembly that is a next step is executed (step 1006). When the error is not within the tolerance, the multilayer film is exfoliated, and the forming of the multilayer film of step 1003 is executed.

The lens barrel assembly (step 1006) sets the mirror in the lens barrel. Then, the visible wave front measurement is executed to the assembled optical system (step 1007), and a position and posture of each mirror are adjusted based on the result. The position and posture of each mirror are adjusted until the wave front aberration in the visible light reaches a predetermined value. When the visible wave front aberration becomes below the predetermined value, the EUV light wave front is calculated. The EUV wave front calculation multiplies the difference between the phase distribution of visible light of each mirror and the phase distribution of the EUV light obtained by step 1004 and 1005, adds it to the phase distribution of visible light of the lens barrel obtained by step 1007, and decides the phase distribution of the EUV light of the lens barrel. It is judged whether the EUV wave front aberration is less than the predetermined value (step 1009) When the EUV wave front aberration is less than the predetermined value, the assembly and adjustment of the lens barrel is ended. When the EUV wave front aberration is more than the predetermined value, the adjustment of the position and posture of each mirror (step 1010), the visible wave front measurement (step 1007), and the EUV wave front calculation is repeated until becoming to less than the predetermined value.

The instant embodiment measures the shape of equivalent reflection surface that originates in the phase difference, and improves the shape measurement accuracy. Therefore, the instant embodiment facilitates the calculation of the wave front of the reflected light and the adjustment the wave front aberration.

A description will be given of the calculation of the shape of "equivalent reflection surface".

The wave front of light is defined as surface where the phase of an electromagnetic field vibration is equal, and is orthogonal for the light beam shown geometrical. The wave front of parallel light is a plane surface that is orthogonal for the traveling direction of light, and such light is called a plane wave.

For a simple example, there is the case where the plane wave of incidence angle 0° reflects from a plane mirror. The wave front is a parallel plane to the mirror surface because of the incidence angle 0°. When a phase difference by reflection on the mirror surface, in other words, the phase difference between the reflected light and the incident light is constant everywhere on the mirror surface, the incident light receives a phase change in a constant amount by the reflection. Therefore, a wave front of the reflected light (=equivalent phase surface) is also parallel plane to the mirror surface.

Next, there is the case where the plane wave reflects from a mirror that is not plane surface. If the phase difference by the reflection on the mirror surface is constant everywhere on the mirror surface, the reflected light receives a constant phase change. However, because an optical path difference is caused by a convexoconcavity of the mirror surface, the wave front of the reflected light (=equivalent phase surface) shifts from the plane surface. When the wave front has risen h at a single position on the mirror surface, the wave front of the reflected light becomes a shape (away from the mirror) that 2 h rises at the position corresponding to it.

When the phase difference generated by the reflection on the mirror surface is partially different than the mirror surface even if a plane mirror, the reflected light receives the phase change that is different according to place. Therefore, a wave front of the reflected light (=equivalent phase surface) becomes a shape that shifts from the plane surface. When the phase difference of the place on the plane mirror by the reflection is $\delta$ (rad) larger than the surrounding area, the wave front of the reflected light reflected from the place becomes a shape (away from the mirror) that rises $\delta\lambda/2\pi$ from the mirror surface compared with the wave front that reflected from the surrounding area. Here, $\lambda$ is the wavelength of the incident light. In this case, the phase difference by the reflection on the surface is constant, and is equivalent to the case for reflecting at a mirror that the mirror surface rises $\delta\lambda/2\pi$.

Thus, a mirror shape to convert the phase difference by the reflection on the surface into the mirror shape is called "equivalent reflection surface".

Moreover, there is a case that the wave front is reflected by a mirror where the surface is not a plane surface and the phase difference generated by the reflection is not constant in the surface. When the shape at the position of the mirror rises h, in addition, the phase difference of this position by the reflection is $\delta$ larger than the surrounding area, it becomes a combination of above 2 examples. Therefore, the shape of the reflected light becomes a shape (away from the mirror) that rises 2 h+$\delta\lambda/2\pi$. In this case, the equivalent reflection surface becomes a shape that rises (h+$\delta\lambda/4\pi$).

When the incidence angle $\theta$ is not 0°, a similar idea consists if a geometrical optical path difference is corrected, and in general, equivalent reflection surface is corrected to h+$\delta\lambda/(4\pi \cos\theta)$. The conventional shape measuring process measures only h, but the instant embodiment calculates h+$\delta\lambda/(4\pi \cos\theta)$, and compares this with the figure error $\sigma$. Moreover, the conventional can not accurately measure the phase difference $\delta$, but the instant embodiment can measure the phase difference $\delta$ easily and accurately as explained as follows. The instant embodiment explained that the plane wave is incident for the simplification. When the incident light is not the plane wave but a spherical wave or a case of superimposing the aberration, it is possible to approximate to the plane wave if there is a enough small area.

When a monochromatic parallel EUV light is incident to the multilayer film, the EUV light reflected from this multilayer film has the same phase difference as the incident light. The incident light and the reflected light interfere inside and outside of the multilayer film, and the standing wave is generated. The present invention obtains the above phase difference $\delta$ by using the standing wave, and accurately measures a relationship between the wave front of the incident light and the wave front of the reflected light. The method in detail is explained as follows.

When the EUV light is incident to the multilayer film and the EUV light reflects from multilayer film, the phase difference between the incident light and the reflected light changes due to a multilayer film structure, an optical constant of material that composes the multilayer film, an incident angle, and the wavelength of the EUV light, etc. An electric field amplitude of the reflected light is $r \times E_0$, where $E_0$ is an electric field strength of the incidence EUV light, and r is an amplitude reflectance of the incidence EUV light. The phase difference $\delta$ between the incident light and the reflected light, and an amplitude E of the electric field where the incident light is overlapped with the reflected light is shown by Equation 3.

$$E = E_0(1 + r \times \cos\delta) \quad (3)$$

The electric field strength is proportional to the square of the amplitude, and the reflectivity R of light is the square of the amplitude reflectance r. Thereby, a ratio (electric field strength ratio) of an electric field strength I (of the standing wave generated by interference of the incident light and the reflected light) of the multilayer film and an electric field strength $I_0$ of the incident light is shown by Equation 4.

$$I/I_0 = (1 + R + 2 \times R^{1/2} \times \cos\delta) \quad (4)$$

The ratio $I/I_0$ of the electric field strength of the multilayer film surface and the electric field strength of the incident light and the reflectivity R are calculated from Equation 4, and the phase difference $\delta$ can be obtained. The reflectivity R can be easily measured by measuring the light intensity of the incident light and the light intensity of the reflected light and calculating a ratio of both. This result of a measuring method of the ratio $I/I_0$ of the electric field strength of the multilayer film surface and the electric field strength of the incident light is explained in detail as follows.

Figure 4:
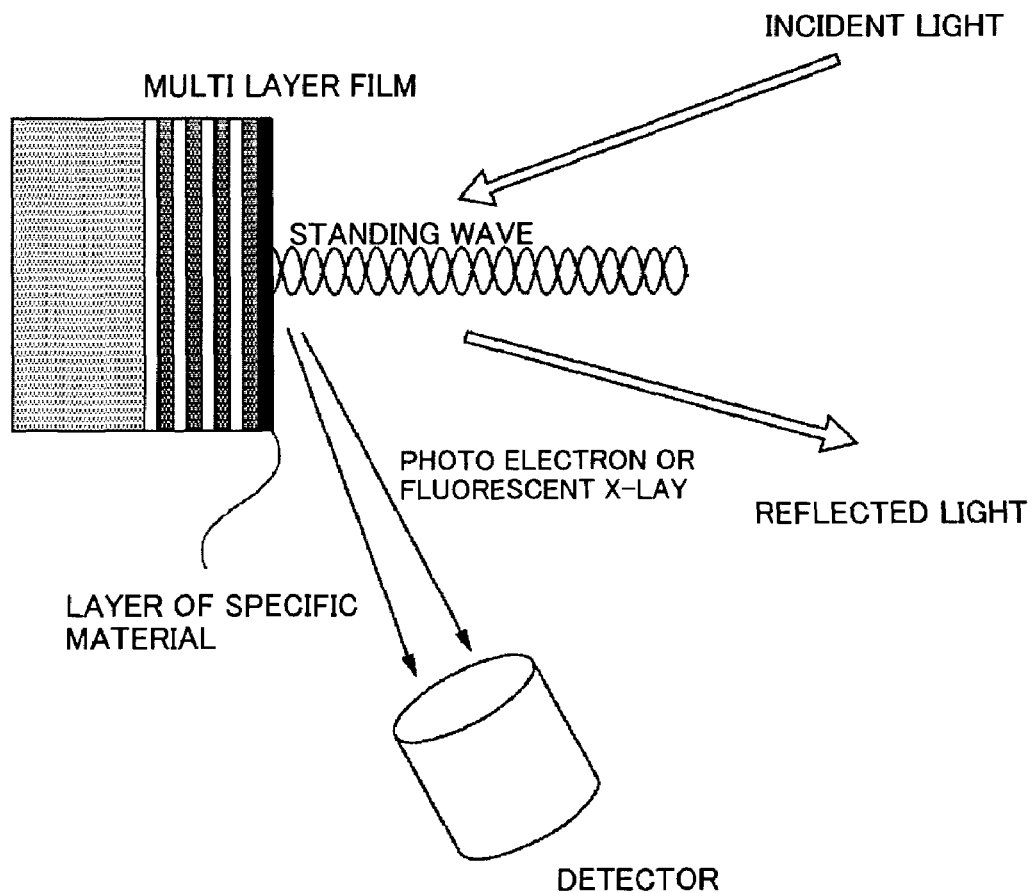
FIG. 4 is a typical view for measuring a field strength ratio of a multilayer film surface used for the instant embodiment.

When the EUV light is irradiated to the material in the vacuum, a part of light is absorbed to the material, and a photoelectric effect is caused, and an electron is discharged. An amount of the discharged photoelectron is proportional to electric field strength at the position. Then, a photoelectric detector such as a microchannel plate and an electron multiplier is installed near an irradiation area of the EUV light on the multilayer film shown in FIG. 4, and the amount of the photoelectron is measured.

When the photoelectric effect occurs on the surface of the material, the discharged electron is discharged with little energy loss in the vacuum. This phenomenon is an external photoelectric effect. On the other hand, when the a photoelectric effect occurs in the material (a position from the surface that is deeper than about 1 nm), the discharged electron inelastically collides with a surrounding atom, loses energy rapidly, and little energy is discharged in the vacuum. The majority of the energy is lost when discharged from the atom even if discharged in the vacuum, and therefore the electron with low energy is discharged. Therefore, the amount of the electron discharged in the vacuum by the external photoelectric effect is proportional to the electric field strength in the nearest surface of the material (an area from the surface that is shallower than about 1 nm). When the EUV light with a incidence angle of $\theta_0$ that satisfies the Bragg's condition (law) and a wavelength of $\lambda$ is incident to the multilayer film composed to obtain the high reflectivity by the predetermined incidence angle of $\theta_0$ and the predetermined wavelength of $\lambda_0$, an amount $Q_R$ of the photoelectron discharged from the surface in the vacuum is proportional to the electric field strength of the standing wave of the nearest surface of the material generated by the interference of the incident light and the reflected light.

When the EUV light is irradiated to the material in the vacuum, a part of light is absorbed to the material, for example, not only the photoelectron but also, for example, fluorescent X-ray as other secondary radiations is discharged. An amount of the discharged fluorescent X-ray is proportional to electric field strength at the position. Then, the amount of fluorescent X-ray is measured by an X-ray detector as the detector shown in FIG. 4, and the amount of fluorescent X-ray may be used as above $Q_R$.

The energy of fluorescent X-ray has a peculiar energy to the atom that discharges it. Therefore, the electric field strength at the position of a specific atom can be measured by being spectrum as for fluorescent X-ray and measuring only the light intensity of X-ray that has the peculiar energy.

Therefore, a thin film composed of an element different from an element that composes the multilayer film is formed on the surface of the multilayer film, and if the light intensity of the peculiar fluorescent X-ray reflected from this element is measured, the electric field strength of the near surface of the multilayer film can be measured.

When the EUV light with a greatly different incidence angle from the incidence angle $\theta_0$ and a wavelength of $\lambda_0$ is incident to this multilayer film, the reflectivity remarkably decreases because it deviates from the condition of strengthening the light intensity of reflected light, and the light intensity of the reflected light becomes remarkably small compared with the light intensity of the incident light. At this time, an amount $Q_0$ of the photoelectron discharged from the multilayer film surface in the vacuum is almost proportional to the electric field strength of the incident light. At this time, when the incidence angle is near 90 degrees, the reflectivity rises by total reflection's occurring. Then, the incidence angle may be not near 90 degrees.

Figure 6:
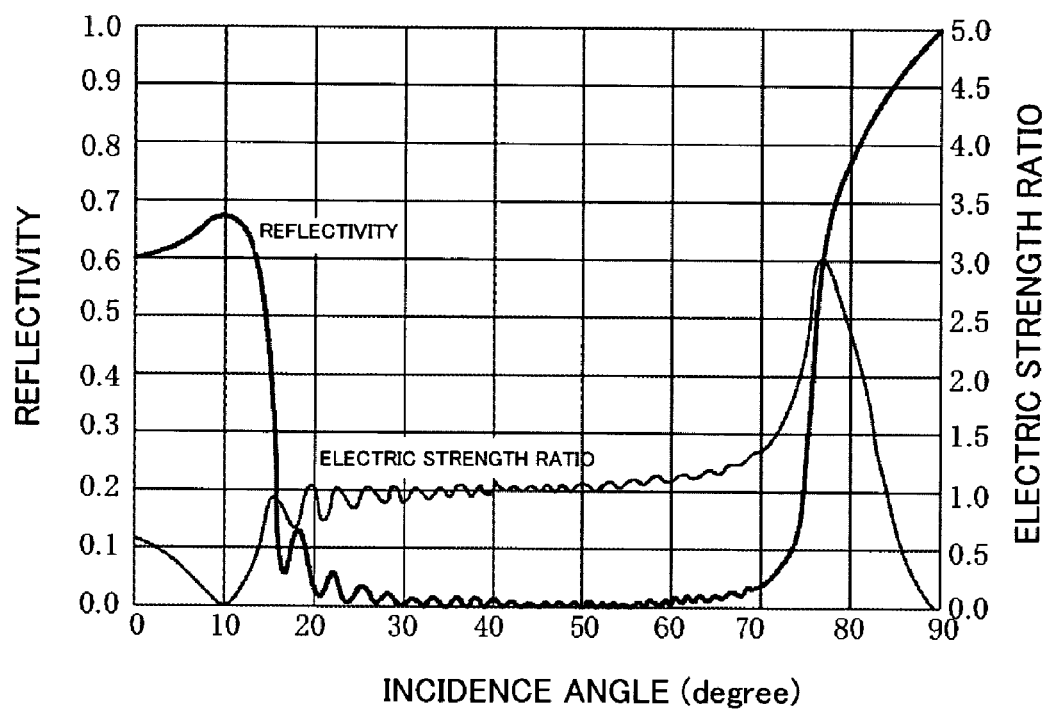
FIG. 6 is a graph of an incidence angle dependency of a reflectivity and an electric field strength ratio.

FIG. 6 is a graph of an example of the incidence angle dependency of the reflectivity and the electric field strength ratio. The electric field strength ratio is a ratio between the electric field strength of the multilayer film surface and the electric field strength of the incident light. This example is wavelength 13.5 nm. A multilayer film that optimized so that the reflectivity may become a peak in the incidence angle 10° is used. In this example, the reflectivity is, in range of about 20 degrees to 70 degrees of the incidence angle, $\frac{1}{10}$ or less of the peak reflectivity (about 70%) in the incidence angle 10°, and standardized electric field strength is a value close to 1. In other words, in range of about 20 degrees to 70 degrees of the incidence angle, the electric field strength on the multilayer film surface is almost equal to the electric field strength of the incident light. The amount $Q_0$ of the photoelectron discharged from the multilayer film surface in the vacuum at this time is almost proportional to the electric field strength of the incident light in such a range of the angle degrees. The amount $Q_0$ of the photoelectron discharged from the surface of the multilayer film, at an angle greatly different from the incidence angle where the reflectivity is maximum value, and to which the reflectivity decreases in the vacuum is almost proportional to electric field strength of the incident light for the multilayer film that the reflectivity becomes a peak in an incidence angle different from the example of the instant embodiment.

Then, the EUV light is irradiated on the multilayer film by two angle conditions with first condition that the incidence angle to obtain high reflectivity by satisfying Bragg's condition and second condition that the incidence angle to which the reflectivity remarkably decreases compared with the first condition without satisfying Bragg's condition, and the amounts $Q_R$ and $Q_0$ of the photoelectron discharged in the vacuum are obtained. Thereby, a ratio of the electric field strength I of the multilayer film (standing wave) and the electric field strength $I_0$ of the incident light can be obtained by the following Equation 5.

$$Q_R/Q_0 = I/I_0 \quad (5)$$

When there is a possibility that the light intensity of the incident light changes between two measurement conditions with different incidence angle, a detector that measures the light intensity of the incident light is installed, the amount of the electron discharged in the vacuum is standardized by the light intensity of incident light, an error because of the change of the light intensity of the incident light can be suppressed. When the EUV light with the incidence angle of $\theta_0$ that satisfies the Bragg's condition (law) and the wavelength of $\lambda$ is irradiated to the multilayer film composed to obtain the high reflectivity by the predetermined incidence angle of $\theta_0$ and the predetermined wavelength of $\lambda_0$, the amount of the photoelectron discharged from the surface in the vacuum is measured by the measuring apparatus shown in FIG. 1. At this time, a light intensity measured by a light intensity monitor 14 is assumed to be $I_{0R}$.

When the EUV light with a greatly different incidence angle from the incidence angle $\theta_0$ and a wavelength of $\lambda_0$ is incident to this multilayer film, the reflectivity remarkably decreases because it deviates from the condition of strengthening the light intensity of reflected light, and the light intensity of the reflected light becomes remarkably small compared with the light intensity of the incident light. At this time, when the amount $Q_0$ of the photoelectron discharged from the multilayer film surface in the vacuum is measured, the beam strength measured by the light intensity monitor 14 is assumed to be $I_{00}$. The error because of the change of the light intensity of the incident light can be suppressed by standardizing the amount of the photoelectron discharged in the vacuum by the light intensity of the incident light (see, Equation 6).

$$(Q_R \times I_{00})/(Q_0 \times I_{0R}) = I/I_0 \quad (6)$$

When the EUV light with a wavelength of $\lambda$ that shifts from the wavelength of $\lambda_0$ in which Bragg's condition is satisfied and the incidence angle $\theta_0$ is irradiated to the multilayer film that satisfies Bragg's condition, the reflectivity remarkably decreases because it deviates from the condition of strengthening the light intensity of reflected light, and the light intensity of the reflected light becomes remarkably small compared with the light intensity of the incident light. For example, in FIG. 8, the reflectivity is $\frac{1}{10}$ or less, and a very small value compared with the peak reflectivity in a wavelength band that deviates from wavelength of 12.8 to 14 nm.

At this time, an amount $Q_L$ of the photoelectron discharged from the multilayer film surface in the vacuum is almost proportional to the electric field strength of the incident light. However, if wavelength used is greatly differs from the wavelength of $\lambda_0$ in which Bragg's condition is satisfied, a discharge efficiency of the photoelectron (discharged photoelectric number by incidence photon unit) shifts, and a wavelength close to $\lambda_0$ is used. Concretely, the discharge efficiency of the photoelectron changes rapidly on the boundary of the absorption edge wavelength of the element that composes the multilayer film surface, and the wavelength may be changed within the range where the absorption edge wavelength of the element that composes the multilayer film surface is not exceeded.

The EUV light is irradiated to the multilayer film while changing the wavelength, and amounts $Q_R$ and $Q_L$ of the photoelectron discharged in the vacuum in two wavelengths with first wavelength to obtain high reflectivity and second wavelength to which reflectivity remarkably decreases compared with it are obtained. Then, a ratio of the electric field strength I of the multilayer film surface and the electric field strength $I_0$ of the incident light can be obtained from Equation 7.

$$Q_R/Q_L = I/I_0 \qquad (7)$$

As similar to the case measured at the different angle, when there is a possibility that the light intensity of the incident light changes between two measurement conditions with different wavelength, a detector that measures the light intensity of the incident light is installed, the amount of the photoelectron discharged in the vacuum is standardized by the light intensity of incident light, an error because of the change of the light intensity of the incident light can be suppressed.

When the EUV light is incident to a single layer film that is composed of a same material that composes the multilayer film surface, the reflectivity becomes extremely small, and the light intensity of the reflected light becomes very small compared with the light intensity of the incident light. At this time, an amount $Q_{00}$ of the photoelectron discharged from the single layer film surface in the vacuum is almost proportional to the electric field strength of the incident light.

Therefore, an amount $Q_R$ of photoelectron discharged in vacuum when the EUV light with the incidence angle to obtain high reflectivity is irradiated to the multilayer film and an amount $Q_{00}$ of photoelectron discharged in vacuum when the EUV light is irradiated to the single layer film that is composed of the same material that composes the multilayer film surface can be obtained, and a ratio of the electric field strength I of the multilayer film surface and the electric field strength $I_0$ of the incident light can be obtained from Equation 8.

$$Q_R/Q_{00} = I/I_0 \qquad (8)$$

In a similar case, when there is a possibility that the light intensity of the incident light changes between two measurement conditions, a detector that measures the light intensity of the incident light is installed, the amount of the photoelectron discharged in the vacuum is standardized by the light intensity of incident light, an error because of the change of the light intensity of the incident light can be suppressed.

Next, a phase $\delta$ is calculated by the following Equation 9.

$$\cos\delta = (I/I_0 - 1 - R)/(2 \times R^{1/2}) \qquad (9)$$

When the phase difference is obtained from the cosine of the phase difference, there is an uncertainty of integral multiples of $2\pi$ in the phase difference, but the phase difference may be continuous in the continuously measured area or for the wavelength change. There is an uncertainty of the positive-negative of the phase difference, but it may have a positive inclination in the near reflection peak of the multilayer film.

The phase difference $\delta$ between the phase of the incident light and the phase of the reflected light can be obtained by measuring the ratio $I/I_0$ of the electric field strength of the multilayer film surface and the electric field strength of the incident light by using the above method. Next, a description will be given of a method of obtaining the wave front of the EUV light reflected by the multilayer film.

The surface shape of the multilayer film (in other words, above h) can be measure with high accuracy by an already-known method in art, for example, a method that mechanically directly measures the shape by touching the stylus to the surface, and a method using an interferometer that uses the visible light and ultraviolet light, etc.

When the phase difference $\delta$ between the incident light and the reflected light by reflection on the mirror surface is constant in the mirror surface and does not depend on the incidence angle, the wave front of the EUV light reflected by the multilayer film can be obtained by using an usually ray tracing method and diffraction integration method, etc. (see, for example, Kunio Tsuruta, Applied optics I, (July, 1990 issue)).

When the phase difference $\delta$ between the incident light and the reflected light by reflection on the mirror surface is changed in the mirror surface and depends on the incidence angle, the wave front of the EUV light reflected by the multilayer film can be obtained from the multilayer film shape by adding the optical path length of only $\delta\lambda/2\pi$ on the multilayer film surface and using the diffraction integration method, etc.

Figure 7:
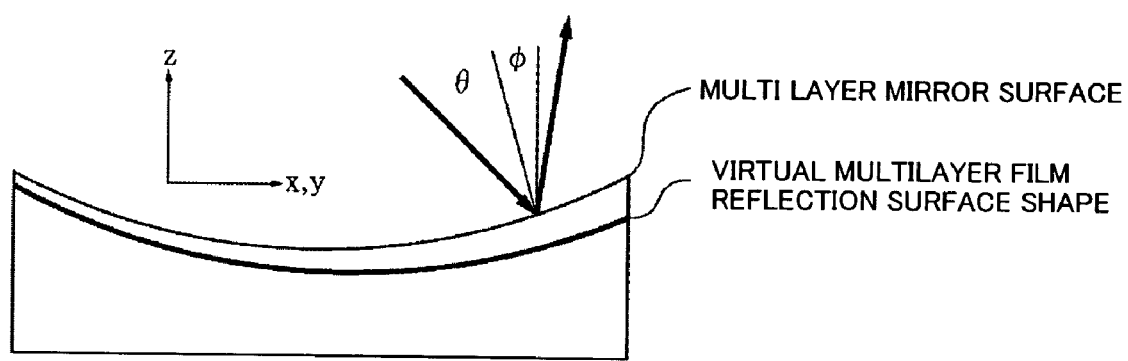
FIG. 7 is a schematic sectional view for explaining a measuring method of a reflection surface shape of a multilayer mirror.

The equivalently surface shape is shown by Equation 10, where a coordinate on the mirror surface is x and y, a geometrical surface shape of the multilayer mirror is h (x, y), an inclination of a mirror normal to XY plane is $\phi$ (x, y), an incidence angle distribution of the EUV light to the mirror surface is $\theta$ (x, y), and the phase difference between the incident light and the reflected light as the EUV light is $\delta$ (x, y, $\lambda$, $\theta$). The wave front of the reflected light or the light beam is obtained by the ray tracing method by using this equivalently surface shape. Here, FIG. 7 is a schematic sectional view for explaining a measuring method of the reflection surface shape of the multilayer mirror.

$$Z(x, y, \theta) = h(x, y) + \frac{\lambda\delta(x, y, \lambda, \theta)}{4\pi\cos\theta(x, y)\cos\phi(x, y)} \qquad (10)$$

Thus, the instant embodiment obtains the phase difference $\delta$ between the incident light and the reflected light by measuring the secondary radiation discharged by the standing wave caused when the EUV light is incident to the multilayer film, and obtains $h+\delta\lambda/(4\pi \cos\theta)$ as the equivalently surface shape to the EUV light or the wave front of the EUV light reflected by the multilayer film from the measurement result of the geometrical surface shape of the multilayer surface (in other words, h) and the phase difference δ. The conventional shape measuring process obtains h, but the shape measuring process of the instant embodiment obtains h+δλ/(4π cosθ), and the accuracy of the shape measuring process improves to the EUV light process. As a result, the instant embodiment facilitates the adjustment of the wave front aberration. Moreover, the instant embodiment can easily obtain the phase difference between the incident light and the reflected light by the measuring apparatus by the addition of the photoelectron or fluorescent X-ray detector to a reflectivity measuring apparatus, and can be measured with high accuracy using a very small apparatus compared with the conventional interference measuring method such as PDI etc.

These principles can be applied to various patterns. Those examples will be clarified in the following embodiments.

First Embodiment

FIG. 3 is a flowchart of an assembly and adjustment of an optical system (lens barrel) composed of a multilayer mirror. Referring now to FIG. 3, a description will be given of a main part of the assembly and adjusting method of the instant embodiment.

First, a substrate is polished (step 1001). The substrate material uses a material with high rigidity, high hardness, and small coefficient of thermal expansion such as a low expansion coefficient glass and silicon carbide. Next, a surface shape is measured by visible light (step 1002). The conventional measuring method with the interferometer using a prototype of a reference surface is the best for the surface shape measuring method. Next, a multilayer film that has a predetermined film thickness on the substrate of predetermined shape is formed (step 1003).

Next, the surface shape of the multilayer film is measured by a reflection position measurement (step 1004) and a visible wave front measurement (step 1005). In this case, the conventional shape measuring process measures only geometrical shape of the multilayer surface. On the other hand, the instant embodiment calculates, as described later, a surface shape of an equivalent reflection surface based on a phase difference between an incident light and a reflected light in addition to the geometrical shape of the multilayer surface. The phase difference between the incident light and the reflected light is calculated by using a secondary radiation radiated according to the standing wave generated when the EUV light with a wavelength of 2 to 40 nm is irradiated to the multilayer film of optical element that the multilayer film that has the predetermined film thickness on the substrate of predetermined shape is formed, and the shape of "equivalent reflection surface" described later is calculated by using the phase difference.

The difference between the wave front of each mirror that composes the optical system by visible light and the wave front of the EUV light can be obtained according to above steps.

Figure 17:
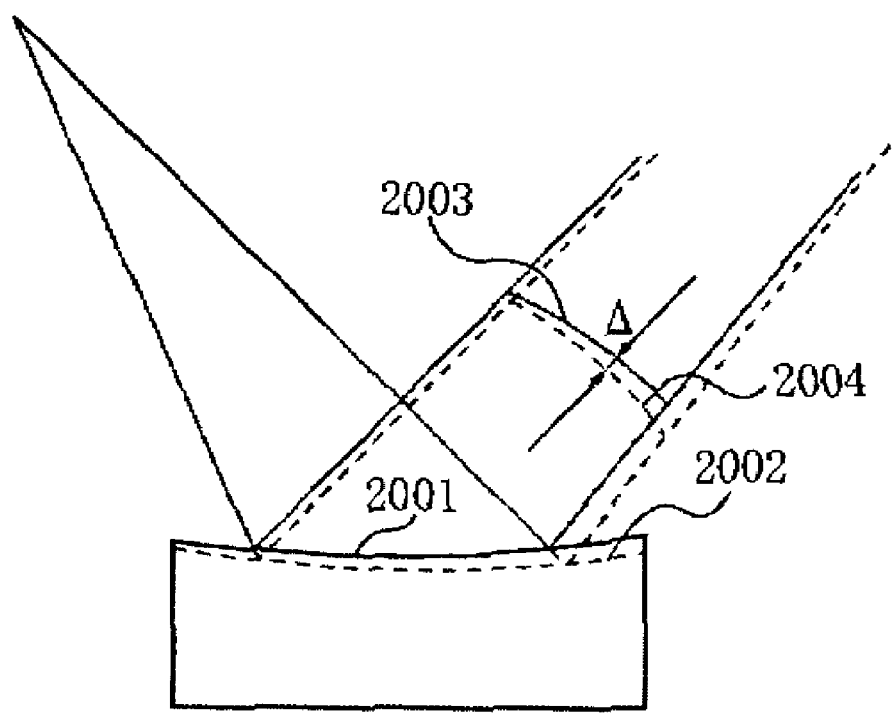
FIG. 17 is a view for explaining a calculation of EUV wave front in FIG. 3.

FIG. 17 is a view for explaining this. In FIG. 17, 2001 is a geometrical surface of the multilayer mirror, and 2002 is a "equivalent reflection surface" calculated by using the standing wave generated in the multilayer film surface neighborhood. 2003 is a reflection wave front reflected from the geometrical surface, and 2004 is a wave front of the EUV light calculated from the "equivalent reflection surface". Δ is a phase difference between the EUV wave front reflected from the geometrical surface and the EUV wave front reflected from the "equivalent reflection surface". A phase distribution of the EUV light on mirror surface can be obtained by calculating this in plural point on the mirror surface.

Steps 1001 to 1005 are executed for all mirrors that compose the optical system, and the difference between the phase distribution of visible light of each mirror and the phase distribution of the EUV wave front is obtained.

Figure 18:
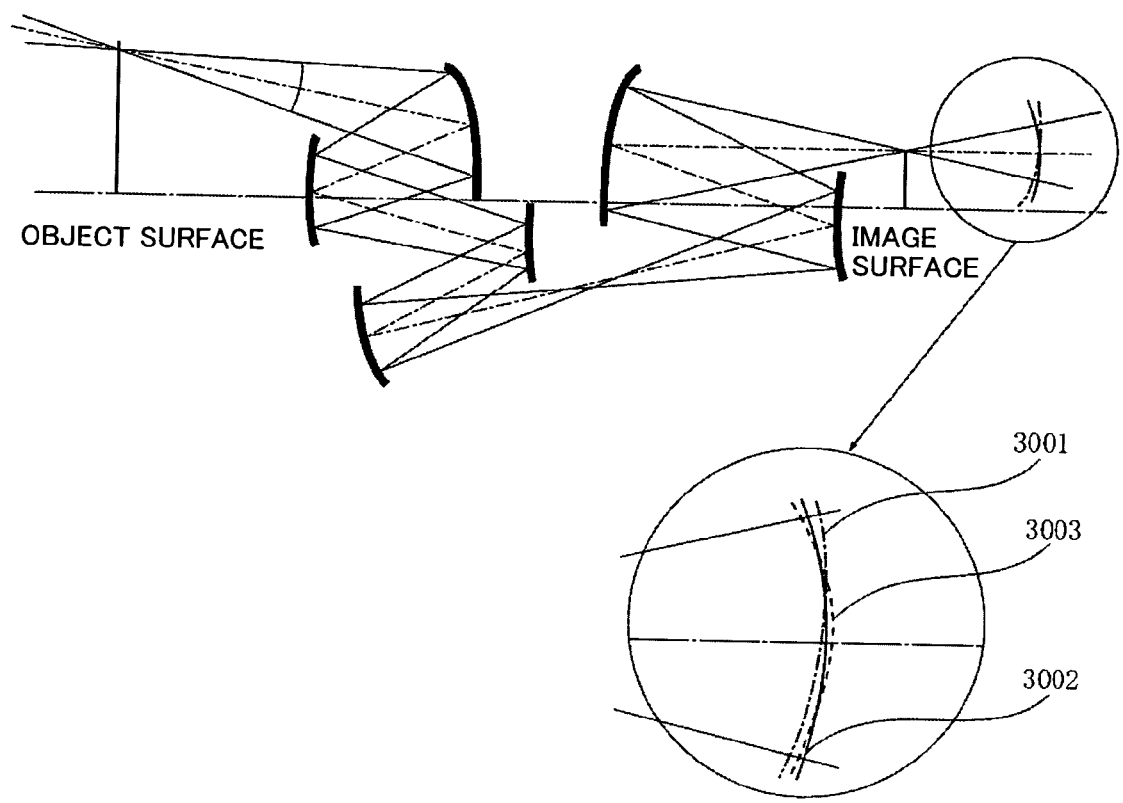
FIG. 18 is a view for explaining a calculation of EUV wave front aberration of a lens barrel in FIG. 3.

Next, the optical system is built (step 1006), and the visible wave front is measured (step 1007). FIG. 18 is a typical view of the mirror that composes the optical system. In FIG. 18, although the number of mirrors is six, the number of mirrors may be not six. 3001 is a wave front of visible light reflected by six mirrors. The wave front receives the figure error of the geometrical reflection surface of each mirror, and shifts to an ideality wave front (3002). In other wards, the wave front has the wave front aberration. The phase distribution difference between visible light and the EUV light obtained in steps 1004 and 1005 is multiplied by the wave front 3001. 3003 is a calculated EUV wave front. The above is the EUV wave front calculation in step 1008 of FIG. 3.

Next, it judged the calculated EUV wave front aberration is below the predetermined value (step 1009). Because the wave front aberration of visible light is measured, the EUV wave front aberration can be calculated from the EUV wave front obtained in step 1008. When the EUV wave front aberration is not below the predetermined value, the position and posture of each mirror are adjusted (step 1010). When the adjustment (step 1010) ends, the visible wave front measurement (step 1007) is executed again, and the EUV wave front aberration is calculated (step 1008). The loop of this steps 1007 to 1010 is repeated until the EUV wave front aberration becomes below the predetermined value.

A description will be given of the measuring method of the phase distribution of the reflected light of the instant embodiment.

Figure 1:
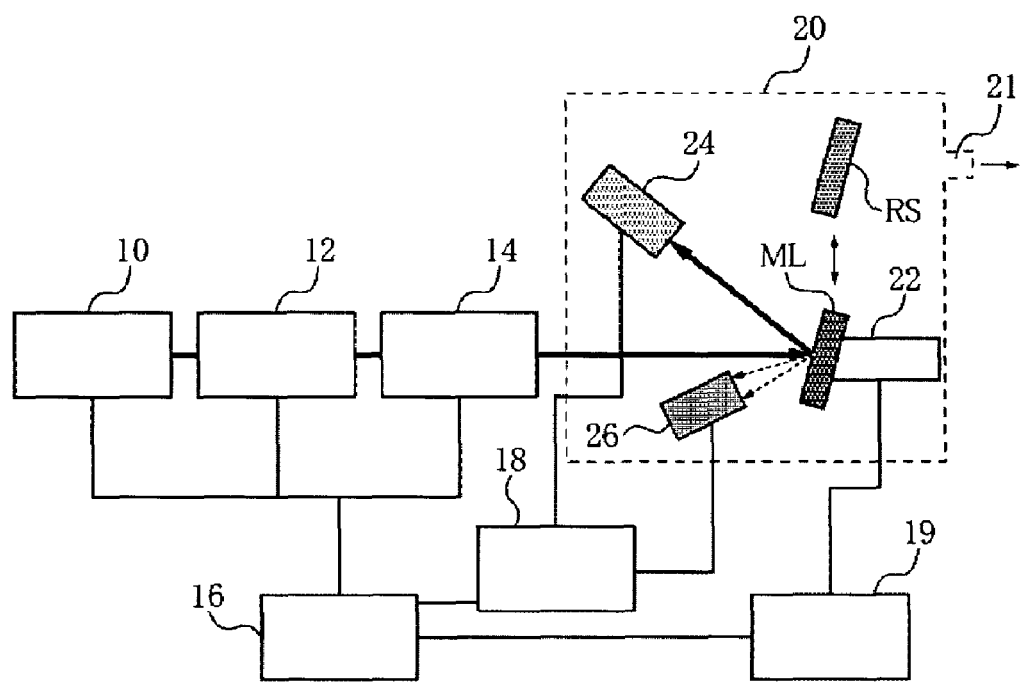
FIG. 1 is a block diagram of an equivalent shape change by a phase difference and a phase change between an incident light and reflection light of a multilayer mirror as one embodiment according to the present invention.

FIG. 1 is a schematic block diagram of a measuring apparatus 1 of the first embodiment. The EUV light radiated from a EUV light source 10 as a synchrotron radiation light source, laser plasma light source, and discharge plasma light source etc. is separated only to predetermined wavelength by a spectroscope 12, and is made monochrome. The EUV light made monochrome is led to a multilayer mirror (or sample) ML as a measurement target or a measuring room 20 that houses a detector 24 and 26. The measuring room 20 has been exhausted to the ultra-high vacuum by an exhaust part 21 such as a vacuum pump etc. to prevent an attenuation of the EUV light and diffusion of the photoelectron, or a pollution adhering to the multilayer film surface. The multilayer mirror ML as the measurement target is fixed on a stage 22 that can be rotated and moved in a direction of translation, and the EUV light made monochrome is incident to a predetermined position of the multilayer mirror ML at a predetermined angle. The EUV light reflected by the multilayer mirror ML is led to a EUV light detector 24, and a light intensity of the reflected light is measured. The detector 24 uses a photodiode, photoelectron multiplier, and CCD, etc. The multilayer mirror ML can be removed by the stage 22, and light intensity of the incident light is measured by directly irradiating the EUV light made monochrome to the detector 24. The output of the detector 24 is converted into a voltage signal by a charge sensitive amplifier, the voltage signal is converted into a digital signal by using an analog-digital converter (ADC) 18, and the digital signal is taken into an operation part 16 such as computers. The operation part 16 can obtains the reflectivity R by calculating the ratio of the light intensity of the reflected light reflected by the multilayer mirror ML and the light intensity of the incident light.

The incident light intensity monitor 14, that measures the light intensity of the monochrome EUV light led to the measuring room 20, has been installed to correct a time change of the light intensity radiated from the light source 10. When the synchrotron radiation light source is used, it may be assumed the incident light monitor by measuring the current of an electron accumulation ring of the light source.

A detector 26 that detects the photoelectron is installed near the multilayer mirror. The detector uses an electron multiplier, and micro channel plate (MCP), etc. An incident electrode of the detector 26 is set to become positive potential for multilayer mirror ML so that the discharged photoelectron is taken easily. When the photoelectron discharged from the surface of the multilayer mirror ML is incident to the electron multiplier or the MCP, the photoelectron receives the electron doubling function by a high voltage that is applied inside, and the photoelectron is output as an amplified electric charge signal. This is converted into the voltage signal using the charge sensitive amplifier, the voltage signal is converted into the digital signal by using the analog-digital converter (ADC) 18, and the digital signal is taken into the operation part 16.

The instant embodiment measures the phase of the reflected light according to the following process.

First, the multilayer sample (multilayer mirror) ML is removed by the stage 22, and the light intensity of the incident light is measured by the detector 24. At this time, wavelength is scanned while changing the wavelength $\lambda$ of the EUV light that exits from the spectroscope 12, and the wavelength dependency of the light intensity of the incident light is measured. The light intensity of the incident light is $I_{R0}(\lambda)$, and an output of the incident light intensity monitor at the measurement is $I_{00}(\lambda)$.

Next, the EUV light made monochrome is set to be incident to the predetermined position of the multilayer film mirror at the predetermined angle by the stage 22, and the light intensity of the reflected light is measured by the detector. The amount of the photoelectron discharged from the sample surface is measured by the detector 26 at the same time. At this time, wavelength is scanned while changing the wavelength setting of the spectroscope 12, and the wavelength dependency of the light intensity of the reflected light and the wavelength dependency of the amount of the photoelectron discharged from surface of the sample ML are measured at the same time. The light intensity reflected by the multilayer sample is $I_{R1}(\lambda)$, the measured discharged amount of the photoelectron of multilayer film is $Q_s(\lambda)$, and the output of the incident light intensity monitor at the measurement is $I_{01}(\lambda)$.

Next, a discharged amount of a photoelectron of a single-layer mirror composed of the material that composes the top layer of the multilayer film as reference sample RS is measured. A thickness of the single layer film of reference sample (or single-layer mirror) RS is more thick than an escape depth of the photoelectron, and the transmittance of the measured light is very small. If the wavelength of light is about 13.5 nm, Mo, Si, and ruthenium (Ru), etc. have a thickness of plural hundreds nm or more. When the top layer of the multilayer film is Si, the Si wafer may be used.

A wavelength dependency of the amount of the photoelectron discharged from the sample surface is measured for the reference sample RS by the method similar to the multilayer film sample ML. The electric field on the sample surface is obtained by adding the electric field of the incident light and the electric field of the reflected light. However, because the reflectivity of the single-layer mirror RS is very small compared with the EUV light, the electric field strength of the single layer film surface is almost equal to the electric field strength of the incident light. At this time, the wavelength dependency of the measured discharged amount of the photoelectron of the reference sample is $Q_R(\lambda)$, and the output of the incident light intensity monitor at the measurement is $I_{02}(\lambda)$.

The wavelength dependency $R(\lambda)$ of the reflectivity of the multilayer mirror ML is shown by Equation 11.

$$R(\lambda)=(I_{R1}(\lambda)\times I_{00}(\lambda))/(I_{R0}(\lambda)\times I_{01}(\lambda)) \tag{11}$$

The wavelength dependency $F(\lambda)$ of the ratio of the discharged amount of the photoelectron of the multilayer mirror ML and the discharged amount of the photoelectron of the reference sample RS is shown by Equation 12.

$$F(\lambda)=(Q_s(\lambda)\times I_{02}(\lambda))/(Q_R(\lambda)\times I_{01}(\lambda)) \tag{12}$$

Figure 8:
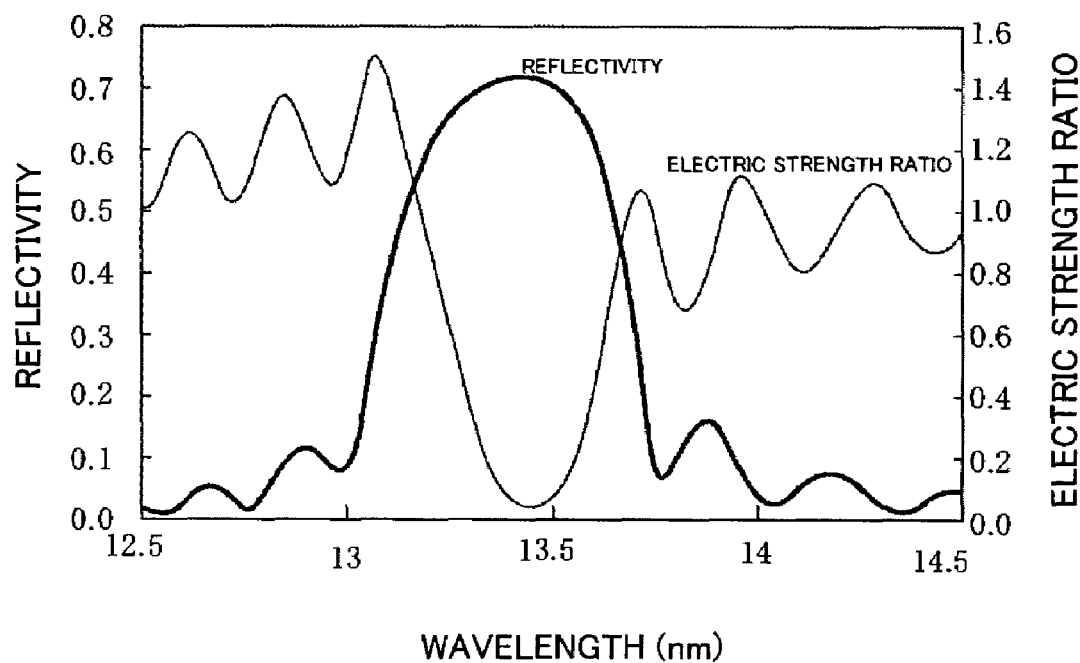
FIG. 8 is a graph of a measurement result of a wavelength dependency of a reflectivity and an electric field strength ratio obtained by the first embodiment.

$F(\lambda)$ is a parameter that shows how many times the discharged amount of the photoelectron of the multilayer mirror ML compared with the single-layer mirror RS. The electric field strength of the single-layer film surface is almost equal to the electric field strength of the incident light, and the ratio $F(\lambda)$ of the discharged amount of the photoelectron of the multilayer mirror and the discharged amount of the photoelectron of the reference sample is equal to an amount (electric field strength ratio) in which whether how many times the electric filed strength of the multilayer film surface compared with the electric field strength of the incident light are shown. FIG. 8 shows the measurement result of the wavelength dependency of the reflectivity and the electric field strength ratio.

Commutatively, the EUV light is irradiated to the multi-layer film while changing the wavelength, and amounts $Q_R$ and $Q_L$ Of the photoelectron discharged in the vacuum in two wavelengths with the first wavelength (of 13.5 nm in the instant embodiment) to obtain high reflectivity and second wavelength (of 12.5 or 14.5 nm in the instant embodiment) in which reflectivity remarkably decreases compared with it are obtained. A parameter that shows how many times the discharged amount of the photoelectron of the multilayer mirror sample compared with the single-layer mirror is obtained by Equation 13, and this parameter may be considered the electric field strength ratio.

$$F=Q_R/Q_L=I/I_0 \tag{13}$$

Next, the phase $\delta$ is calculated by the following Equation 14.

$$\cos\delta=(F(\lambda)-1-R(\lambda))/(2\times R(\lambda)^{1/2}) \tag{14}$$

Figure 9:
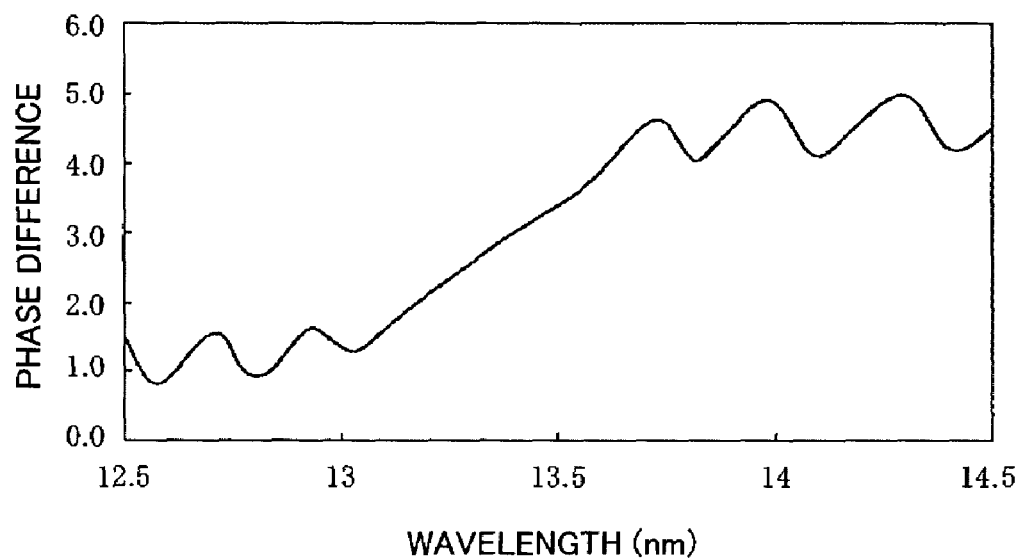
FIG. 9 is a graph of a wavelength dependency of a phase difference between an incident light and reflected light obtained by the first embodiment.

When the phase difference $\delta$ is obtained from the cosine of the phase difference $\delta$, there is an uncertainty of integral multiples of $2\pi$ in the phase difference $\delta$, but the phase difference $\delta$ may be constant in the continuously measured area for the wavelength change. There is an uncertainty of the positive-negative of the phase difference $\delta$, but it may have a positive inclination in the wavelength band of near reflection peak of the multilayer film. FIG. 9 shows the wavelength dependency of the phase difference $\delta$ between the incident light and the reflected light obtained thus.

The surface shape of the multilayer film sample is measured by a Fizeau interferometer and Mirror interferometer, etc. that use visible light or ultraviolet light. The surface shape measurement and the phase measurement by the standing wave are acceptable ahead either, and may be simultaneous.

Next, the shape of equivalent reflection surface for the EUV light (in other words, $\delta\lambda/(4\pi \cos\theta)$ and $h+\delta\lambda/(4\pi \cos\theta)$) is calculated.

Figure 10:
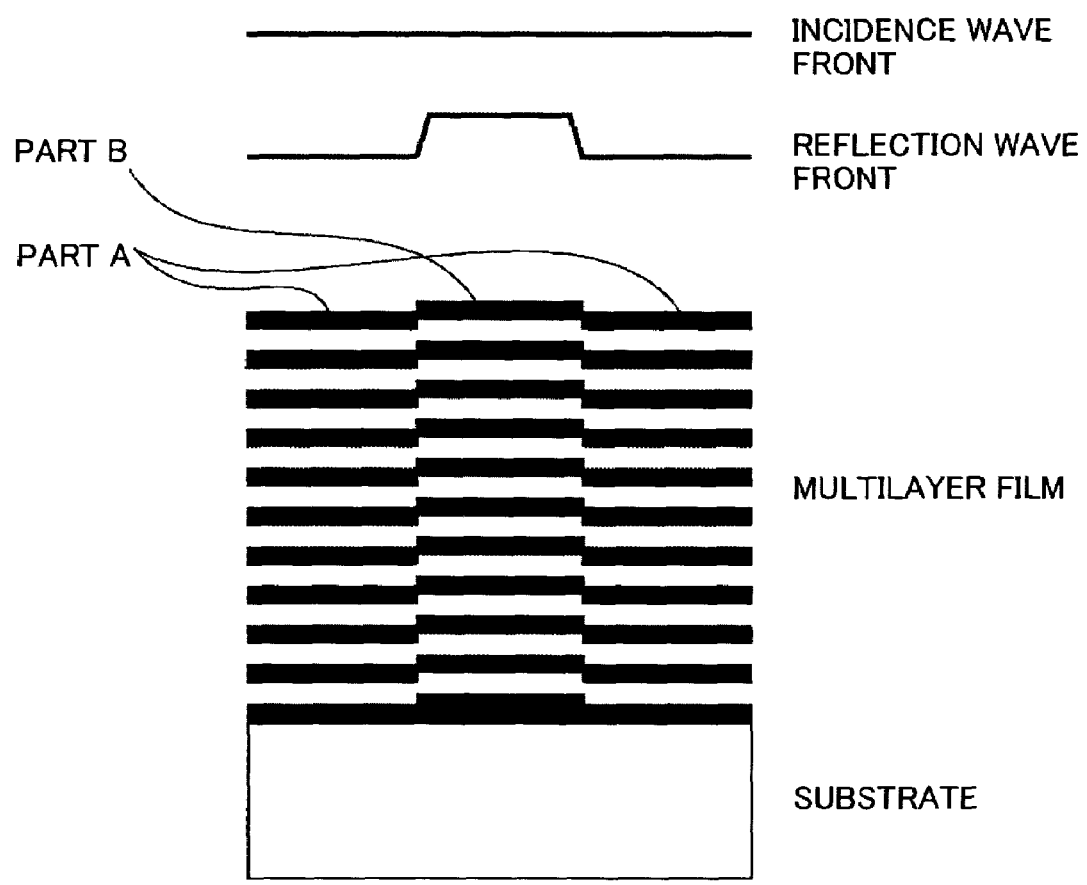
FIG. 10 is a schematic sectional view of one example of a multilayer film structure used for the first embodiment.

FIG. 10 shows one example of the multilayer film structure. This example causes a difference in the lowest layer of the multilayer film, and a part B is higher than a part A. The coating cycle is 6 nm, the wavelength of the incidence EUV light is 12 nm, the incidence angle is 0°, and the difference of the part B is 1.5 nm. When the shape is measured by the interferometer that uses visible light, the part B is measured high of 1.5 nm compared with the part A. The phase difference between the part A and the part B is not measured by the above phase measurement that uses the standing wave. Therefore, the part B is 1.5 nm higher than the part A in the shape of equivalent reflection surface for the EUV light. Thereby, when the plane wave is incident to this multilayer film, the part B becomes a shape advanced only by 3 nm (about ¼ wavelength) compared with the part A in the wave front of the reflected light.

Figure 11:
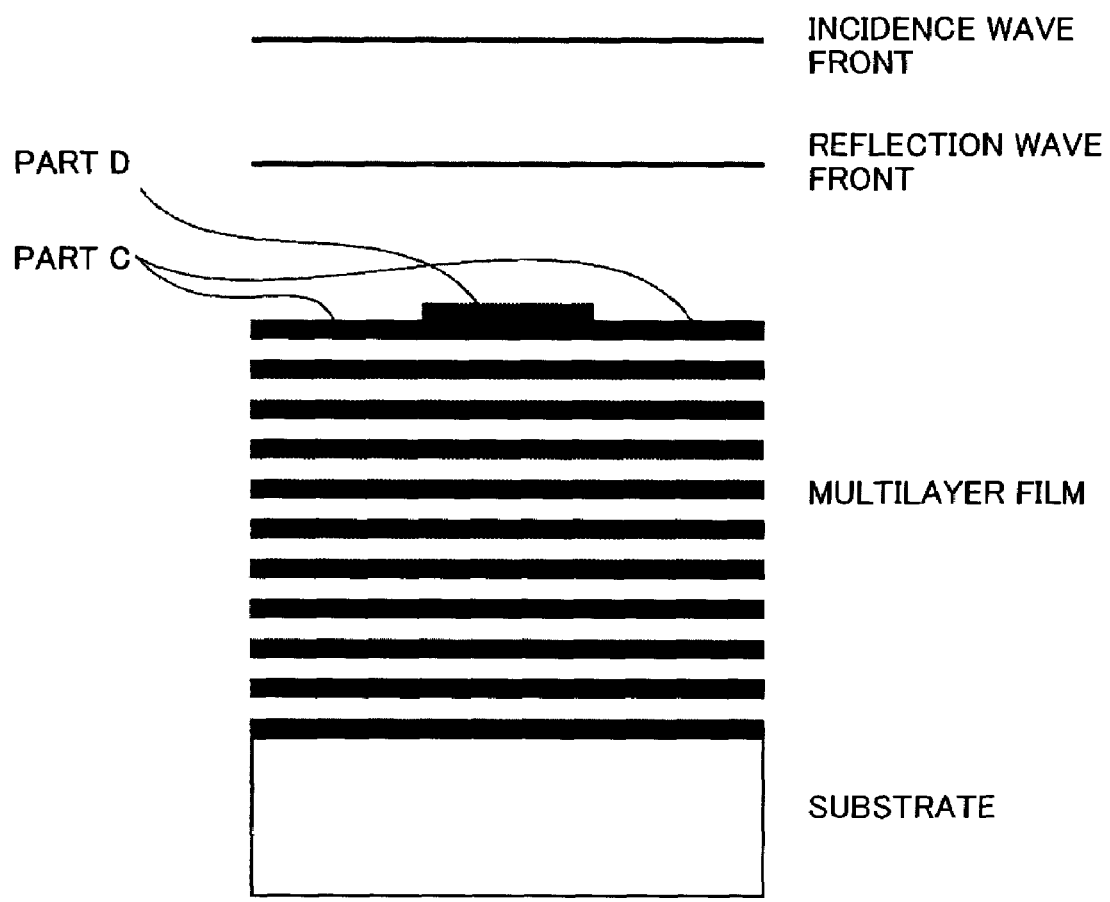
FIG. 11 is a schematic sectional view of another example of a multilayer film structure used for the first embodiment.

FIG. 11 shows another example of the multilayer film structure. This example causes a difference in the top layer of the multilayer film, and a part D is higher than a part C. The coating cycle is 6 nm, the wavelength of the incidence EUV light is 12 nm, the incidence angle is 0°, and the difference of the part D is 1.5 nm. When the shape is measured by the interferometer that uses visible light, the part D is measured high of 1.5 nm compared with the part C. The phase difference between the part C and the part D is $\pi/2$ by the above phase measurement that uses the standing wave. Therefore, the shape of equivalent reflection surface for the EUV light is denied by the surface shape and the reflection phase difference each other, and becomes plane surface. In other words, when the plane wave is incident to the multilayer film, the wave front of the reflected light becomes plane surface.

The above embodiment can obtain the phase difference between the incident light and the reflected light by using the standing wave generated when the EUV light is incident to the multilayer film. Moreover, the above embodiment can obtain the equivalent reflection surface shape for the EUV light or the wave front (phase distribution) of the EUV light reflected from the multilayer film using the measurement result of the multilayer film surface shape and phase difference. The present invention can easily obtain the phase difference between the incident light and the reflected light by the measuring apparatus only of the addition of the photoelectron detector to a usually reflectivity measuring apparatus, and can be measured with high accuracy using a very small apparatus compared with the conventional interference measuring method such as PDI etc. Moreover, the instant embodiment corrects an instability of the incident light due to an instability of the light source and spectroscope by using the incident light monitor, and can be measured in high accuracy by suppressing the error originates in those instabilities. As a result, the assembly and adjusting method of the optical system (lens barrel) of the instant embodiment can adjust the wave front aberration of the optical system accurately, simply, and inexpensively than prior art.

Second Embodiment

The instant embodiment sets and adjusts the optical system according to the flowchart of FIG. 3 shown in the first embodiment, and uses a measuring apparatus similar to the measuring apparatus shown in first embodiment. The instant embodiment is different from the first embodiment in the point to measure the phase of the reflected light by the following process.

First, the multilayer mirror ML is removed by the stage 22, and the light intensity of the incident light is measured by the detector 24. At this time, wavelength is scanned while changing the wavelength $\lambda$ of the EUV light that exits from the spectroscope 12, and the wavelength dependency of the light intensity of the incident light is measured. The light intensity of the incident light is $I_{R0}(\lambda)$, and an output of the incident light intensity monitor at the measurement is $I_{00}(\lambda)$. Next, the EUV light made monochrome is set to be incident to the predetermined position of the multilayer mirror at the predetermined angle, and the light intensity of the reflected light is measured by the detector. The amount of the photoelectron discharged from the surface of the sample (multilayer mirror) ML is measured by the detector 26 at the same time. At this time, wavelength is scanned while changing the wavelength setting of the spectroscope 12, and the wavelength dependency of the light intensity of the reflected light and the wavelength dependency of the amount of the photoelectron discharged from the surface of the sample ML are measured at the same time. The light intensity reflected by the multilayer sample is $I_{R1}(\lambda)$, the measured discharged amount of the photoelectron of multilayer film is $Q_s(\lambda)$, and the output of the incident light intensity monitor at the measurement is $I_{01}(\lambda)$. As abovementioned, the wavelength dependency $R(\lambda)$ of the reflectivity of the multilayer mirror ML is shown by Equation 11.

On the other hand, the wavelength dependency $G(\lambda)$ of the discharged amount of the photoelectron of the multilayer mirror ML is shown by Equation 14.

$$G(\lambda) \, Q_s(\lambda)/(I_{01}(\lambda) \times \lambda) \qquad (14)$$

Figure 12:
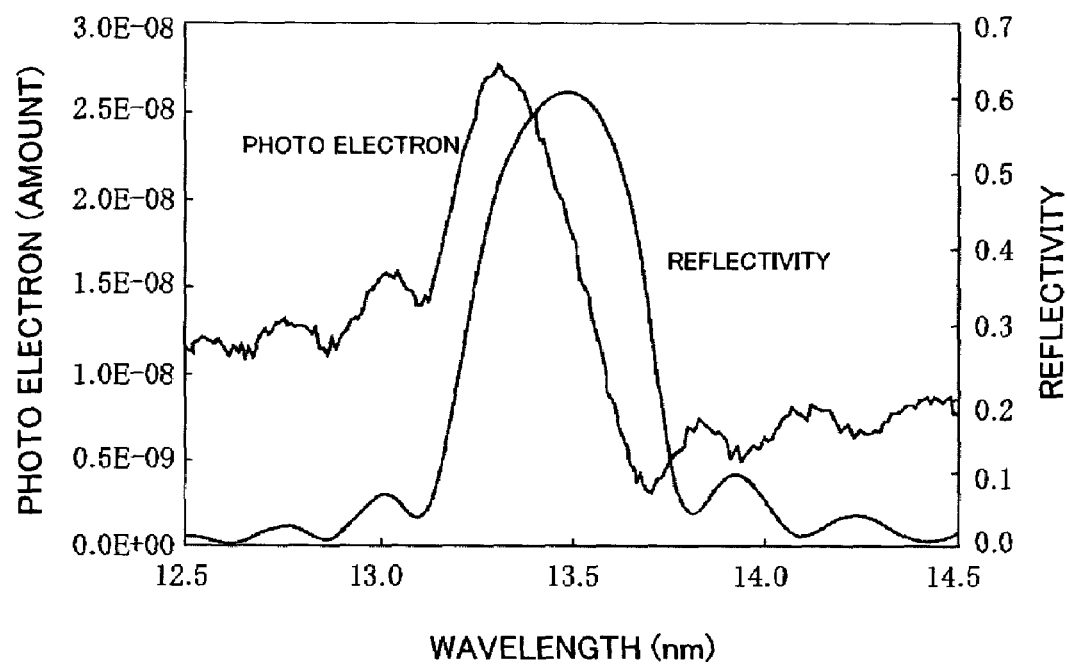
FIG. 12 is a graph of a measurement result of a wavelength dependency of a reflectivity and a photoelectron discharge amount used for the second embodiment.

This is a parameter that shows a ratio between the discharged amount of the photoelectron of the multilayer mirror and a photon number of the incident light. The discharged amount of the photoelectron of one photon is almost constant in the wavelength bands other than in the neighborhood of the wavelength of absorption edge of the material that composes the top layer of the multilayer film. Therefore, $G(\lambda)$ is an amount (electric field strength ratio) in which whether how many times the electric field strength of the multilayer film surface compared with the electric field strength of the incident light are shown. FIG. 12 shows an example of the measurement result of the wavelength dependency of the reflectivity and the discharged amount G of the photoelectron.

Next, the phase $\delta(\lambda)$ is calculated by the model calculation of the multilayer film. The reflectivity of the multilayer film and the phase of the reflected light can be obtained by the model calculation. For example, the model calculation is disclosed in "Controlling contamination in Mo/Si multilayer mirrors by Si surface capping modifications".

Fresnel equations are applied to the each interface of the multilayer film, and a relationship of the complex amplitude of each electric field (incidence wave, transmitted wave, and reflection wave) before and behind the interface is requested for each interface. The recurrence formula is led from this relationship, and a relationship of the complex amplitude of the electric field of the incidence wave and reflection wave of the multilayer film (in other words, complex reflectivity) is finally calculated from start to the substrate side of the multilayer film. The phase is obtained from the imaginary part of the complex reflectivity.

Figure 13:
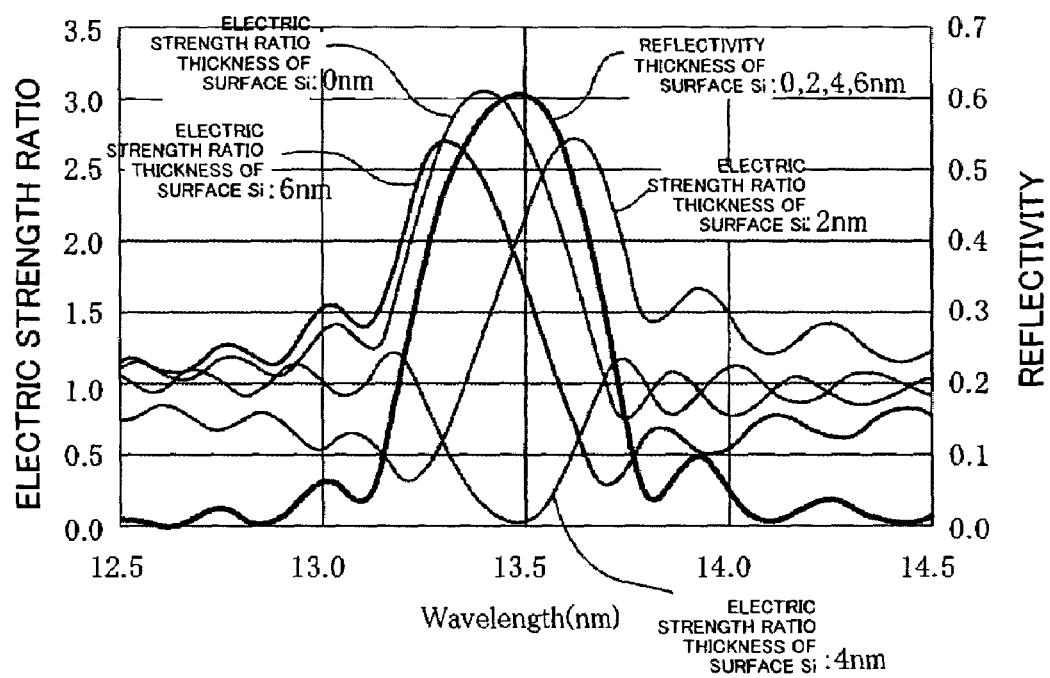
FIG. 13 is a graph of a relationship among a film thickness, wavelength, electric field strength, and reflectivity by model calculation used for the second embodiment.

The electric field strength of the standing wave of the surface is obtained from the result. The thickness of the silicon of the top layer of the multilayer film composed the molybdenum and silicon is assumed to be a parameter in the calculated model. FIG. 13 shows the example of the calculation result. The reflectivity and the electric field strength ratio of the surface respectively when the thickness of the silicon of the top layer of the multilayer film composed the molybdenum and silicon is 0, 2, 4, and 6 nm are plotted. The reflectivity hardly changes even if the thickness of the silicon of the top layer changes. On the other hand, the electric field strength ratio of the surface changes remarkably in proportion to the thickness of the silicon of the top layer.

First, the fitting changes the coating cycle (sum of the thickness of molybdenum and silicon) of the multilayer film composed the molybdenum and silicon of the calculation model, the best coating cycle is obtained so that the measurement value of the reflectivity must correspond to the calculation value.

Next, the thickness of the silicon of the top layer of the calculation model is changed, and the best thickness of the silicon is obtained so that the electric field strength ratio must correspond to the measurement value. At this time, because an absolute value of the electric field strength ratio has the uncertainty, the wavelength dependency of electric field strength ratio corresponds. In other words, the constant and the thickness of the silicon of the top layer are decided so that the product of the measured electric field strength ratio and the constant corresponds to the calculation value. For example, the square sum of the difference between the product of the measured electric field strength ratio and the constant and the electric field strength ratio obtained by the model calculation is assumed to be an evaluation function, the parameter is changed and fitting so that the value of this evaluation function becomes the minimum.

Figure 14:
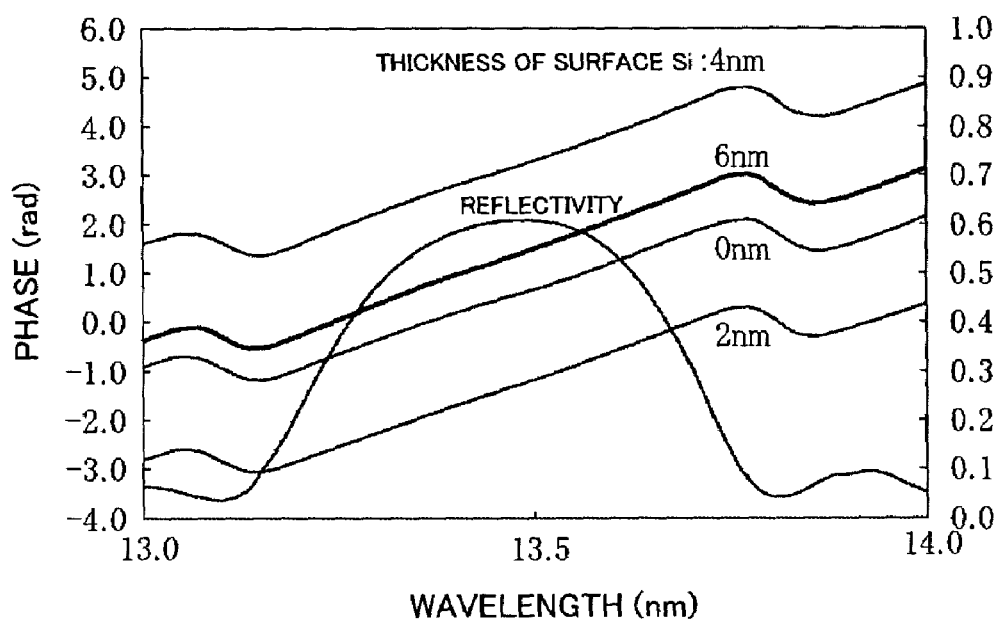
FIG. 14 is a graph of a relationship among a film thickness, wavelength, phase, and reflectivity by model calculation used for the second embodiment.

Thus, the calculation model that best reproduces the measurement value is decided. Next, the phase of the reflected light of the multilayer film is obtained from the decided model. This phase is assumed to be the measured phase difference between the incident light and the reflected light of the multilayer mirror ML. In the instant embodiment, the model that the thickness of the silicon of the top layer is 6 nm is the most corresponding to the measurement value shown in FIG. 12. The phase obtained from this model is FIG. 14.

The phase of each point on the multilayer film is measured by using this method, and the shape of equivalent reflection surface for the EUV light or the wave front of the reflected light when the EUV light is incident to this multilayer film can be obtained by adding the measurement result of the multilayer mirror shape.

The instant embodiment can obtain the phase difference between the incident light and the reflected light even if the wavelength dependency of the amount of the photoelectron discharged from the surface of the reference sample RS is not measured by comparing it with the model calculation, and the measurement is further simplified. Moreover, when the wavelength dependency of the amount of the photoelectron discharged from the surface of the reference sample RS is measured, the phase difference between the incident light and the reflected light may be obtained by comparing it with the model calculation. This method can obtain the phase difference between the incident light and the reflected light more precisely. As a result, the assembly and adjusting method of the optical system (lens barrel) of the instant embodiment can adjust the wave front aberration of the optical system accurately, simply, and inexpensively than prior art.

Third Embodiment

Figure 15:
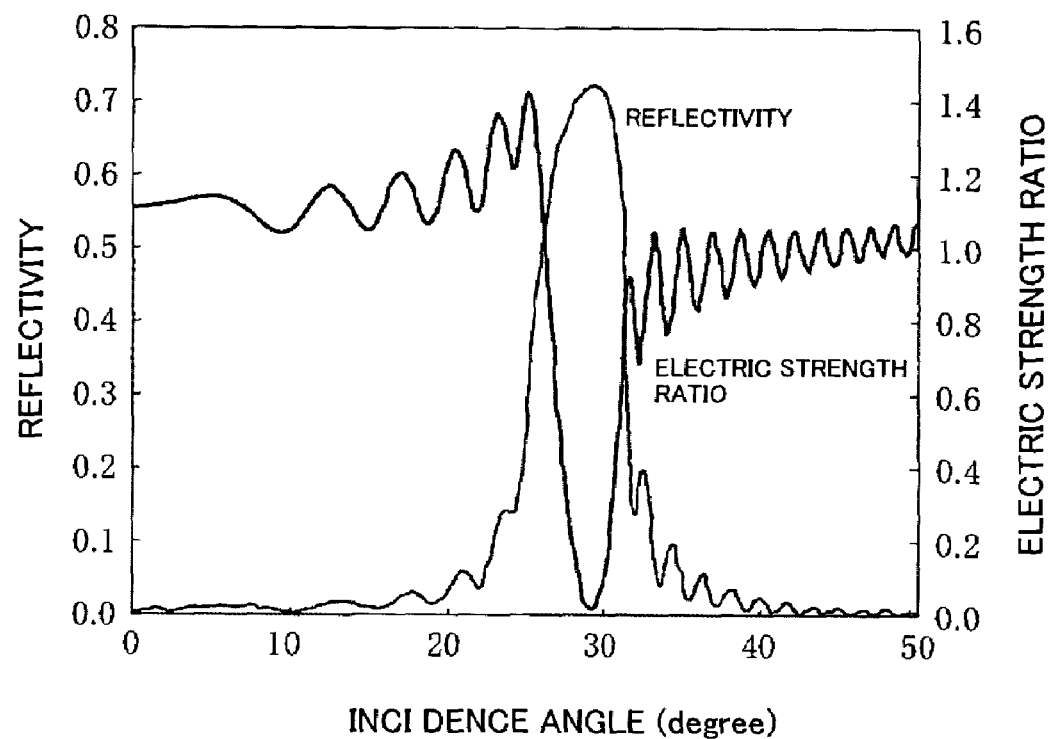
FIG. 15 is a graph of a relationship among an incidence angle, reflectivity, and electric field strength by model calculation used for the third embodiment.

In the instant embodiment, the EUV light is irradiated to the multilayer mirror ML, and the reflectivity of the EUV light and amount of the discharged photoelectron is measured at the same time. At this time, the reflectivity and the incidence angle dependency of the photoelectron amount are measured while changing the incidence angle of the EUV light relative to the sample. FIG. 15 shows an example of the measurement result. The coating thickness of the multilayer film that added molybdenum to silicon is 8 nm, and the wavelength of the EUV light is 13.5 nm. The phase difference is calculated by this result and Equation 15.

$$\cos\delta(\lambda)=(F(\lambda)-1-R(\lambda))/(2\times R(\lambda)^{1/2}) \quad (15)$$

To convert electric filed strength from the discharged photoelectric amount, the reference sample RS is used as well as the first embodiment, or the discharged photoelectron amount is standardized by the discharge amount of the photoelectron at the incident angle with low reflectivity of the multilayer mirror ML, and the electric field strength ratio is obtained. The discharged amount of the photoelectron at the incidence angle about 0° or 50° is used and standardized for this example. Commutatively, the discharged amount of the photoelectron of one photon is almost constant in the wavelength bands not close to the wavelength of absorption edge of the material that composes the top layer of the multilayer film, so the wavelength is moved a little, and the discharged photoelectron amount may be standardized by the discharge amount of the photoelectron measured by wavelength which greatly lowers the reflectivity of the multilayer film.

The phase of each point on the multilayer film is measured by using this method, and the shape of equivalent reflection surface for the EUV light or the wave front of the reflected light (phase distribution) when the EUV light is incident to this multilayer film can be obtained by adding the measurement result of the multilayer mirror shape.

Fourth Embodiment

The instant embodiment sets and adjusts the optical system (lens barrel) according to the flowchart of FIG. 3 shown in the first embodiment. However, the instant embodiment uses a measuring apparatus different from the first embodiment.

Figure 16:
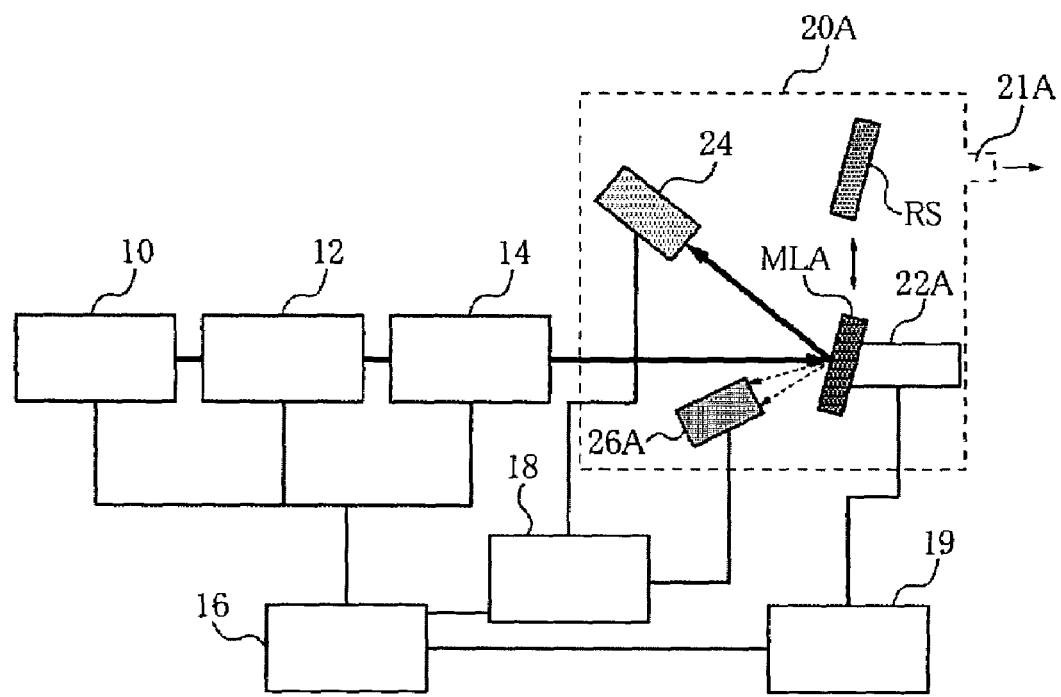
FIG. 16 is a block diagram of an equivalently shape change by a phase difference and a phase change between an incident light and reflected light of a multilayer mirror as another embodiment according to the present invention.

Referring now to FIG. 16, a description will be given of a measuring apparatus 1A of the instant embodiment. Here, FIG. 16 is a schematic block diagram of the measuring apparatus 1A of the instant embodiment. The measuring apparatus 1A of the instant embodiment is similar to the structure of the measuring apparatus 1 shown in first embodiment. However, a measuring room 20A has been exhausted to the ultra-high vacuum by the exhaust part 21 such as the vacuum pump etc. to prevent the attenuation of the EUV light and the absorption of the fluorescent X-ray, or the pollution adhering to the multilayer film surface. A detector 26A that detects the fluorescent X-ray is installed at near the multilayer mirror. The detector 26A uses a X-ray solid state detector (SSD), cooling SSD, and micro-calorimeter, etc. This detector may have a characteristic in which energy of the photon of fluorescent X-ray is classified. In other words, the detector measures the spectrum of fluorescent X-ray, or only light intensity of fluorescent X-ray in specific energy range.

A layer that consists of a specific material that differs from the material that composes the lower layer of the multilayer film is formed on the surface of the multilayer film sample. For example, the ruthenium layer with the thickness of plural ones nanometer is installed in the surface of the multilayer film that consists of the molybdenum and silicon. The X-ray solid state detector is set to the detected energy range to detect only peculiar characteristic X-ray from an element that composes the top layer.

The thin film that consists of ruthenium or carbon as a cap layer to prevent oxidation of the multilayer film and adhesion of contamination is formed on the top layer of the multilayer mirror. Therefore, the detected energy range is set to detect only the peculiar characteristic X-ray from the element that composes this layer.

The instant embodiment measures the phase of the reflected light according to the process similar to the first embodiment. In this case, the first embodiment measures the amount of the photoelectron discharged from the surface of the sample, but the instant embodiment measures the phase by measuring the amount of the fluorescent X-ray discharged from the surface of the sample. The X-ray solid state detector of the instant embodiment is set to the detected energy range to detect only peculiar characteristic X-ray to element that composes the top layer of the multilayer film, so the detected light intensity of the fluorescent X-ray is proportional to the electric field strength of the top surface of the multilayer film.

Fifth Embodiment

Figure 5:
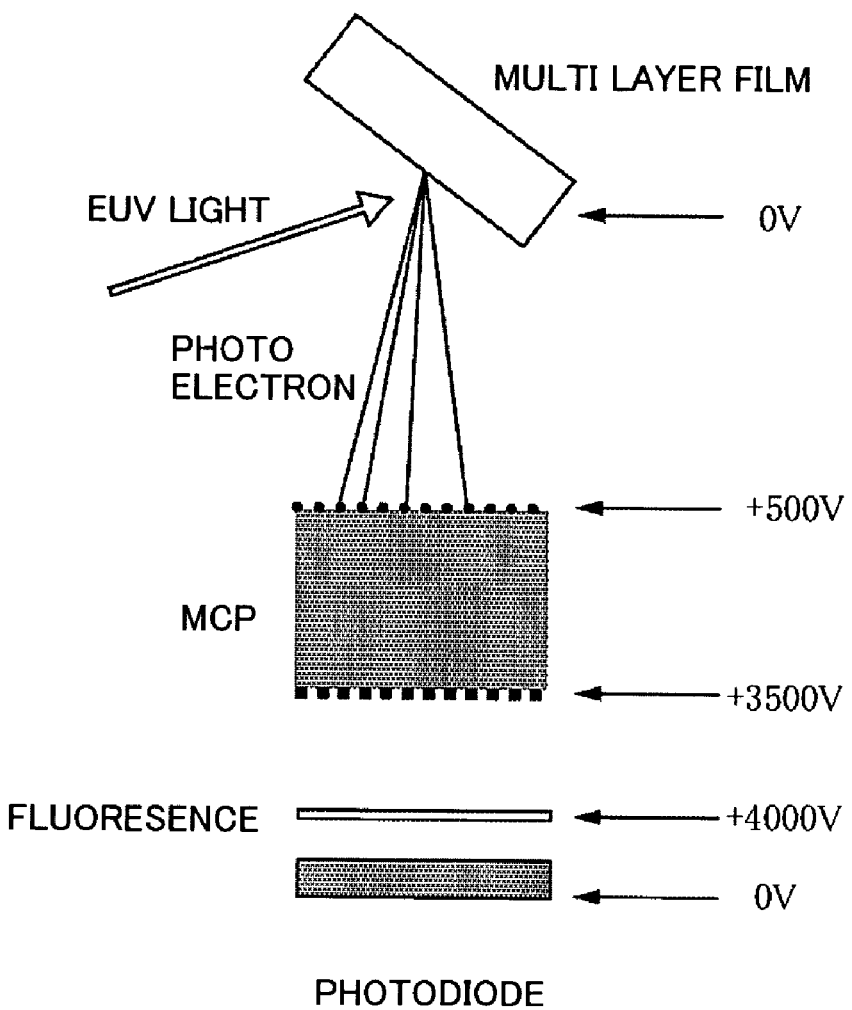
FIG. 5 is a typical view for measuring an electric field strength ratio of a multilayer film surface used for the instant embodiment.

The instant embodiment sets and adjusts the optical system (lens barrel) according to the flowchart of FIG. 3 shown in the first embodiment, and uses a measuring apparatus similar to the measuring apparatus shown in fourth embodiment. The instant embodiment measures the photoelectron discharged from the multilayer film surface. The micro channel plate is used as a photoelectron detector as shown in FIG. 5. Here, FIG. 5 is a typical view for measuring the electric field strength ratio of the multilayer film surface. The EUV light is irradiated to the multilayer film sample, and the photoelectron discharged by the photoelectric effect is incidence to the MCP. To efficiently collect the photoelectrons, the voltage is applied to the surface of the incidence side of MCP to be the potential of the plus for the multilayer film (for instance, potential from about plus 100 to 500 volts).

A strong potential difference from about 2000 to 6000 volts is applied in the MCP for electron acceleration, amplifies an incidence electron from about 106 to 108, and is discharged from the exit side. This electron collides to a fluorescence board, maintained at a higher potential higher than the MCP exit side, and generates the fluorescence of visible light. This fluorescence is detected by the photodetector, for example, photodiode and photoelectron multiplier. The MCP exit side is maintained at a high positive voltage, and the fluorescence board is maintained at a higher positive voltage (for instance, about plus 3000 to 8000 volts to the multilayer film) to attract the electron. However, because the electron is converted into visible light by the fluorescence board, the photodetector can be set to an arbitrary potential. For example, the photodetector is maintained at the same potential as the multilayer film.

When the electron is detected while amplified, the output of the detector becomes a high voltage of the plus. Therefore, the technique for cutting the direct current at the condenser and inputting the only alternating current element that changes timewise is used to input it to the signal processing system. This method is effective to the pulse light source such as the laser plasma and the discharge plasma light source, etc. that changes timewise. However, when the consecutive timewise light such as the synchrotron radiation (SR) is used for the light source, this method to which direct current element is intercepted by the condenser cannot be used. When the fluorescence that generates by irradiating the electron output from MCP to the fluorescence board is detected by the photodetector, the photodetector can be maintained the same potential as the multilayer film. Therefore, there is an advantage that can be directly input to the signal processing system.

The instant embodiment measures the phase of the reflected light by using the measuring apparatus according to the process similar to the second embodiment. Therefore, the detail is omitted.

Sixth Embodiment

The instant embodiment irradiates the EUV light to the multilayer mirror ML, and measures the reflectivity of the EUV light and the amount of the fluorescent X-ray at the same time according to the process similar to the third embodiment. In this case, the third embodiment measures the amount of the photoelectron discharged from the surface of the sample, but the instant embodiment measures the phase by measuring the amount of the fluorescent X-ray discharged from the surface of the sample.

Seventh Embodiment

The instant embodiment differs from the first embodiment in the measuring method of the phase of the reflected light, and other points are similar. A description will be given of a measuring method of the phase of the reflected light of the instant embodiment. This method has been described to U.S. Patent Publication No. 2003/144819 in detail.

Figure 19:
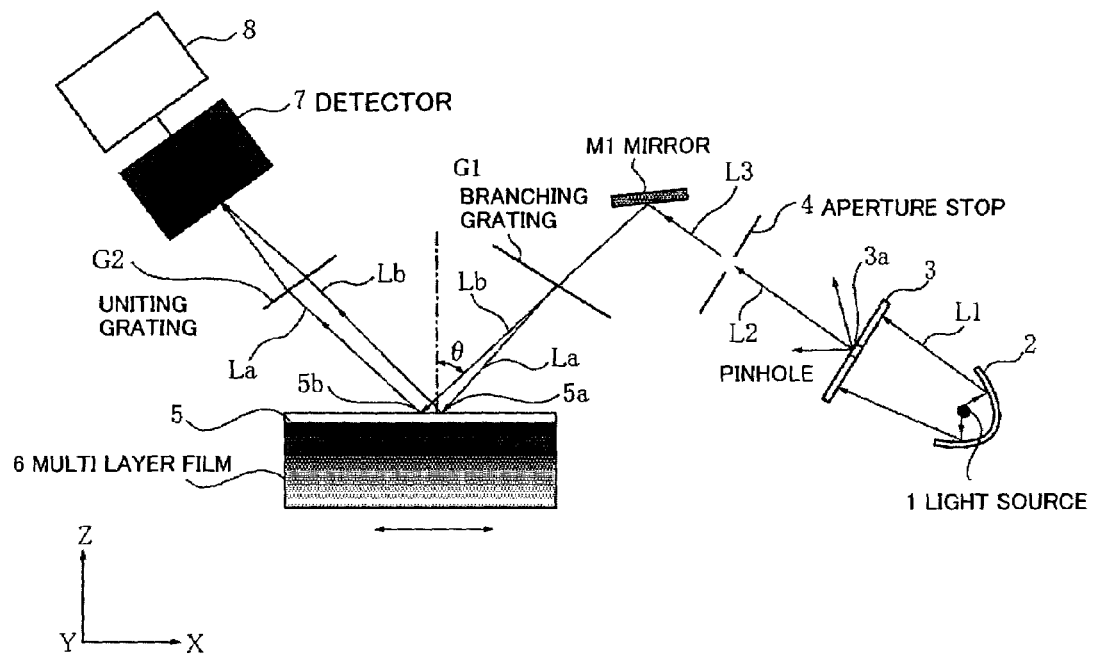
FIG. 19 is a view for explaining a phase measuring method of the fourth embodiment.

FIG. 19 is a partially schematic view of a phase measuring apparatus of the present invention, shows a situation that measures a phase information of the film on the mirror surface intended for EUV wavelength band. FIG. 19 is a partially schematic view of measurement of the reflection phase distribution of the film by a position on the mirror surface that the film is formed.

A light L1 from a light source 1 is reflected by a reflection mirror 2 of an ellipsoid or paraboloid, is converted into the wave front from a point light source through a pinhole 3a installed in a member 3, and straightens the wave front. The light source uses the laser plasma light source or synchrotron radiation (SR). A light L2 from the pinhole 3a is converted into a beam L3 with a diameter of 1 mm through an aperture stop 4. The beam L3 is divided into two lights La and Lb by a branching grating G1 through a mirror M1, and is irradiated from the diagonal to tow points (that shift minutely) 5a and 5b on a multilayer mirror 6 with which a multilayer film 5 is formed. An incidence angle of the lights La and Lb to the film 5 is slightly different, and is considered to be the almost same angle θ for easiness.

Because a difference between the incidence position 5a and 5b is also little, it is considered the almost same position. A reflected light La and Lb from irradiated two points 5a and 5b are united and interfered by a uniting Grating G2, and an interference signal is obtained by a detecting part 7 such as CCD. When the wavelength of the light from the light source 1 is an outside of the wavelength band that the detecting part can detect, the light is incident into a fluorescent board, and the interference information formed at the fluorescent board may be detected by the detecting part.

An operation part 8 measures the reflection phase distribution of the multilayer film 5 in the incidence angle θ of light by using the interference signal from the detecting part 7 while changing a relative position of the multilayer mirror 6 and the measuring system. The phase difference of the film 5 at a position x obtains the phase difference of φ(x+Δx, θ)–φ(x, θ) as a strength of the interference signal, where a position of reflection phase distribution by the position is x, and the incidence angle is θ. Δx, in other wards, a shift amount of the beam is made very minute (the wave front is shifted by the differentiation), and dφ(x, θ)/dx is obtained.

The beam La and Lb scan all surface of the multilayer film 5 by a relative movement of the multilayer mirror 6 and the measuring system, and the reflection position distribution φ(x, θ) in the first incidence angle θ by the position of the film 5 is calculated by integrating at the position x on the film 5. The beam with the extension is incident into the film surface, and gets a data as a two-dimensional signal. Thereby, the connection of the phase data by integration improves, and a highly accurate measurement result is obtained. The date may be gathered by scanning at high speed the narrow beam and using a detecting part that has a small receiving surface.

The instant embodiment measures the reflection phase information on the film at each position without using an optical surface to form the reference wave front by using the branching grating G1 and the uniting grating G2.

In FIG. 1, the incident light to the multilayer mirror is incident into the multilayer mirror in the state that the incident light has an extension within the range where a positional differentiation is possible and condenses at one point. In other words, the incident light condenses one point that has a size where the positional differentiation is possible.

The instant embodiment can obtain the relative phase of the reflected light as a function at the position of the mirror (film) using the measurement data obtained by the measuring system shown in FIG. 19. The distribution (in-surface) of the phase difference between the reflected light of visible light and the reflected light of EUV light can be calculated from the function and the measurement result of the multilayer film surface shape.

The first to seventh embodiments of the present invention calculates the wave front of the lens barrel in EUV light from the difference between the phase of the reflected light in visible light and the phase of the reflected light in the EUV light of a reflection-type optical element of each unit that composes the lens barrel and the reflection wave front by visible light in state assembled as the lens barrel. The first to seventh embodiments of the present invention execute the assembly and adjustment of a reflection-type optical element in the lens barrel by using the reflection wave front of EUV light. Therefore, the assembly and adjustment of the lens barrel can be easily and inexpressibly executed.

Eighth Embodiment

Figure 2:
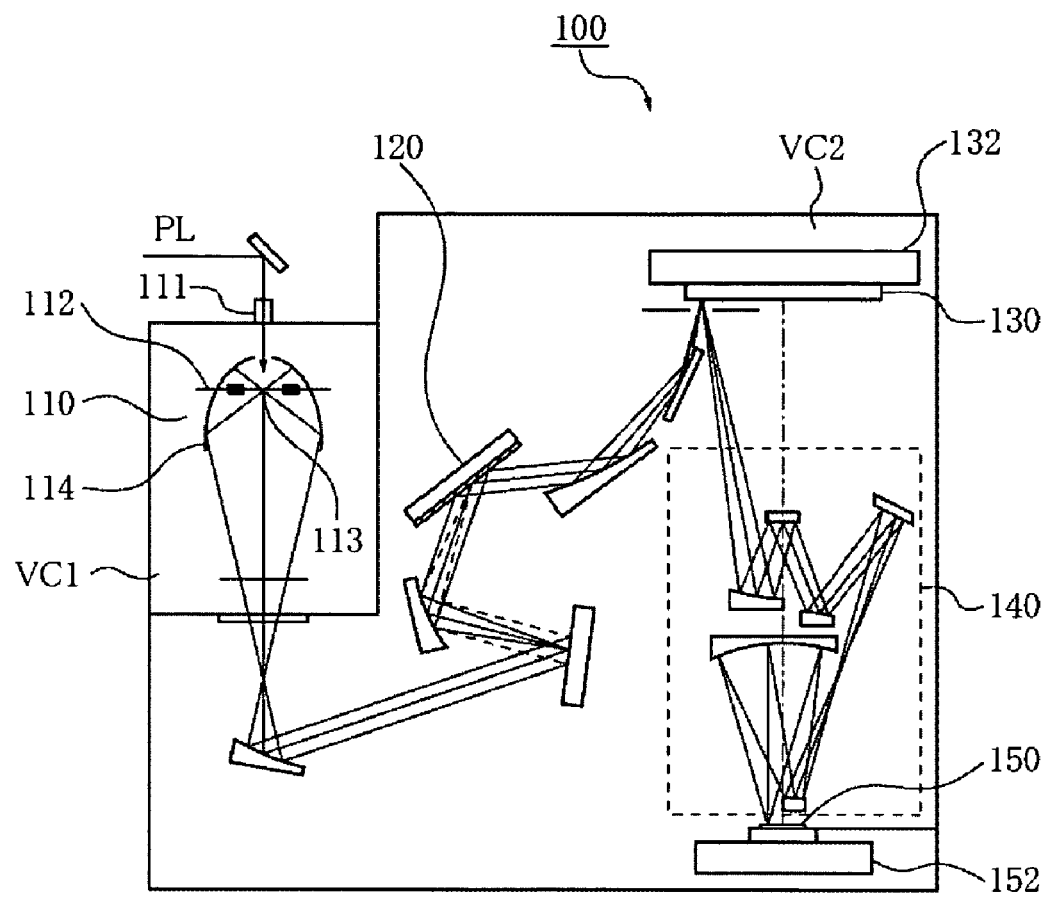
FIG. 2 is a schematic view of a EUV exposure apparatus of the instant embodiment.

Referring now to FIG. 2, a description will be given of a EUV exposure apparatus 100 of the present invention. FIG. 2. is a schematic sectional view of the EUV exposure apparatus. The EUV exposure apparatus 100 is a projection exposure apparatus that uses, as illumination light for exposure, EUV light (e.g., with a wavelength of 13.5 nm) to perform a step-and-scan exposure that transfers a circuit pattern on a reticle onto an object to be exposed. Referring to FIG. 2, the EUV exposure apparatus 100 includes a EUV light source part 110, an illumination optical system 120, a reflection-type mask (reflection-type reticle) 130, a mask stage 132, a projection optical system 140, a wafer 150, and a wafer stage 152. A vacuum chamber VC2 houses the illumination optical system 120 to the wafer stage 152.

The EUV light source part 110 irradiates a highly intensified pulse laser light PL to a target material supplied from a target supply system 112 arranged in a vacuum chamber VC1 and put in a condenser point position 113, via a condenser optical system (not shown) from a laser light source (not shown), thus generating high-temperature plasma for uses as EUV light with a wavelength of about 13.5 nm emitted from this. The EUV light source part 110 excites the target material to high-temperature plasma by irradiating a high-luminance excitation pulse laser to the target material, corrects the EUV light from the light with a wavelength band from infrared, ultraviolet to EUV light that is isotropically irradiated from the plasma when the plasma is cooled by a condenser mirror 114, and uses this as the exposure light.

The pulse laser PL uses, for example, Nd:YAG laser or excimer laser. The vacuum chamber VC1 maintains a vacuum atmosphere environment for the EUV light that a transmittance to the atmosphere is small. The pulse laser is condensed in the condenser point position 113 through a window 111 installed in the vacuum chamber VC1. The target material depend on the wavelength of the generated EUV light, uses a metallic thin film such as copper (Cu), lithium (Li), and zinc (Zn) etc., an inert gas such as xenon (Xe) etc., and a liquid drop, etc., and is supplied to the vacuum chamber VC1 by the target supply system 112 such as a gas jet. The target supply system 112 has a target recover system that recovers a remained target material because all of the supplied target material do not contribute to the plasma.

The EUV light introduced into the vacuum chamber VC2 illuminates the mask 130 that has a predetermined pattern through the illumination optical system 120. The illumination optical system 120 leads the EUV light, and illuminates the mask 130. The illumination optical system 120 includes a plural mirror, an optical integrator, and an aperture. The optical integrator serves to uniformly illuminate the mask with a predetermined NA. The aperture is arranged in a conjugate position for the mask 130, limits an illumination area to an arc shape on the mask 130.

The EUV light selectively reflected by the reflection-type mask 130 is projected onto the wafer 150 that a photoresist applied by the projection optical system 140 composed of the plural reflection mirror, and transfers the pattern of the mask 130 to the wafer 150.

The illumination area of the mask 130 and a projection image of the wafer 150 are limited within an arc shape area of extremely narrow same image height to obtain an excellent image that suppresses aberration of the projection optical system 140. Then, the exposure apparatus 100 adopts the scanning exposure method that exposes by synchronously scanning the mask stage 132 and the wafer 152 to expose all patterns formed in the mask 130 to the wafer 150.

The condenser mirror 112, the illumination optical system 120, the reflection-type mask 130, and the projection optical system 140 have the multilayer film of Mo and Si on the substrate to efficiently reflect the EUV light, and the surface roughness requires 0.1 nm on standard deviation to suppress a decrease of the reflectivity. Moreover, the reflection mirror of the projection optical system requires the shape precision of 0.1 nm on standard deviation in addition to above surface roughness, and needs an extremely high precision optical system. Therefore, it is necessary to arrange the optical element that composes the projection optical system 140 in high accuracy extremely. The assembly and adjusting method of the present invention is applied to such projection optical system 140, and the wave front aberration of the projection optical system 140 is appropriately adjusted. The exposure apparatus of the instant embodiment has the optical system that appropriately adjusts the wave front aberration, and enables a highly accurate exposure.

Ninth Embodiment

Figure 20:
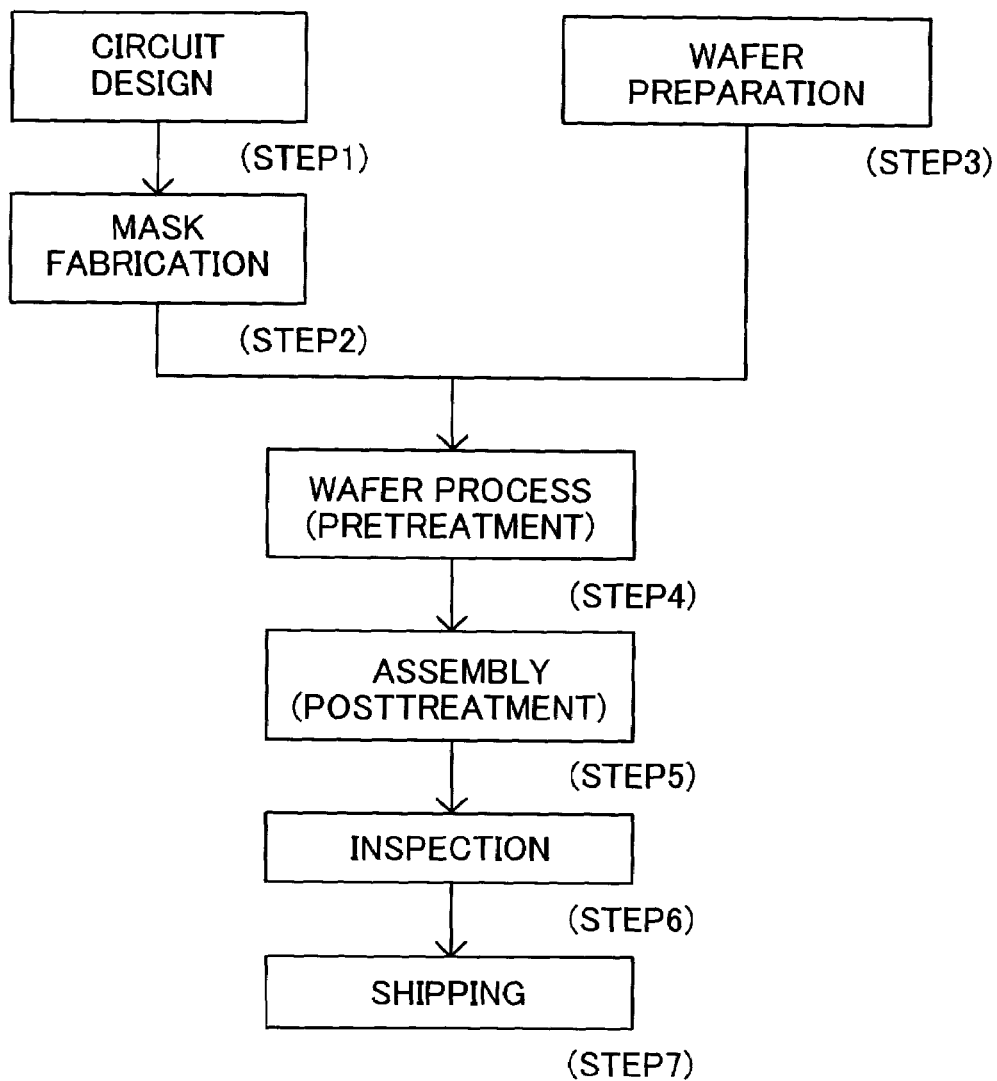
FIG. 20 is a flowchart for explaining how to fabricate devices (such as semiconductor chips such as ICs, LCDs, CCDs, and the like).
Figure 21:
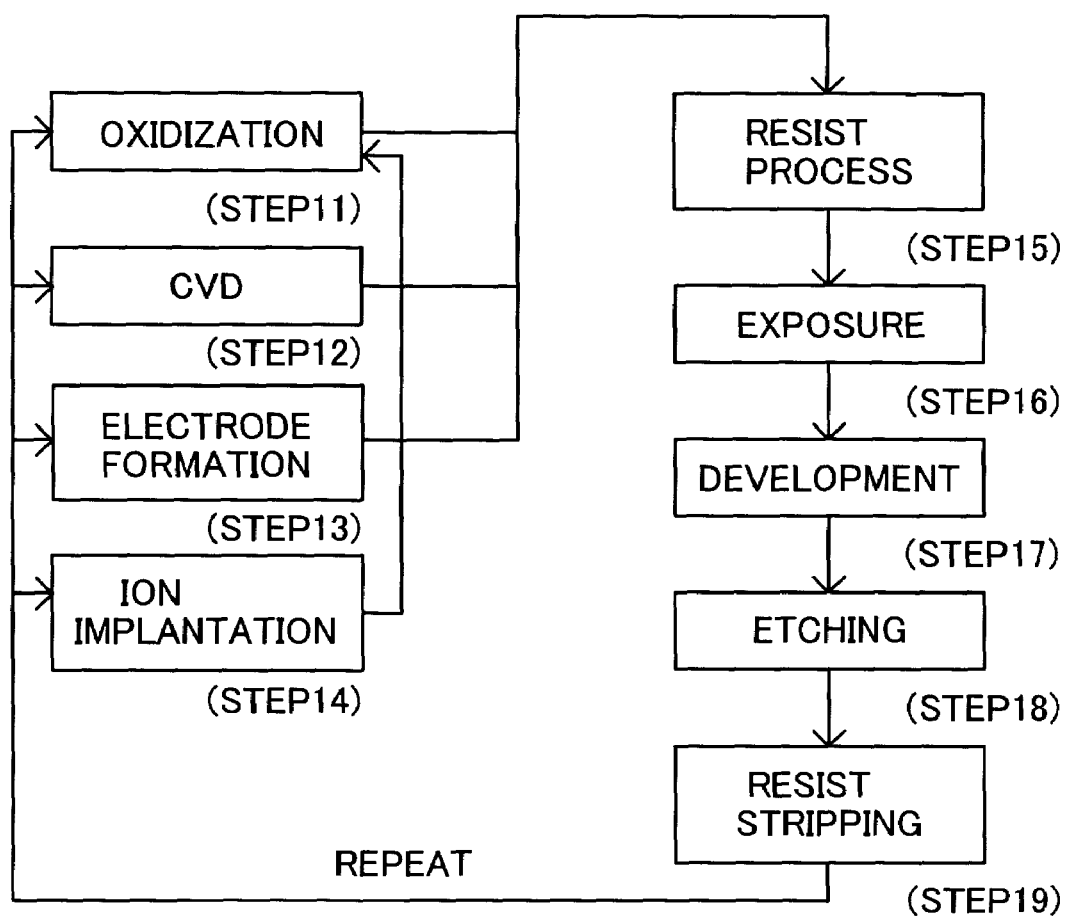
FIG. 21 is a detailed flowchart of a wafer process in Step 4 of FIG. 20.

Referring now to FIGS. 20 and 21, a description will be given of an embodiment of a device fabrication method using the above mentioned exposure apparatus 100. FIG. 20 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 21 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. Use of the fabrication method in this embodiment helps fabricate higher-quality devices than conventional methods. Thus, the device fabrication method using the exposure apparatus 100, and resultant devices constitute one aspect of the present invention.

Furthermore, the present invention is not limited to these preferred embodiments and various variations and modifications may be made without departing from the scope of the present invention.

This application claims foreign priority benefits based on Japanese Patent Applications No. 2004-139062, filed on May 7, 2004, which is hereby incorporated by reference herein in its entirety as if fully set forth herein.

What is claimed is:

1. An adjusting method of an optical system that includes plural optical elements each having a multilayer film, said adjusting method comprising:
a first measuring step of measuring, for each optical element, a phase distribution of an EUV light when the EUV light is reflected on the optical element, and a phase distribution of a light with a wavelength that is longer than that of the EUV light when the light with the wavelength is reflected on the optical element;
a first finding step of finding, for each optical element, a difference between the phase distribution of the EUV light when the EUV light is reflected on the optical element and the phase distribution of the light with the wavelength when the light with the wavelength is reflected on the optical element;
a second measuring step of measuring a phase distribution of the light with the wavelength when the light with the wavelength passes the optical system;
a second finding step of finding a phase distribution of the EUV light if the EUV light passes the optical system based on the difference for each optical element found by the first finding step and the phase distribution measured by the second measuring step; and
an adjusting step of adjusting at least one of a position and a posture of the optical element based on the phase distribution found by the second finding step.

2. An adjusting method according to claim 1, wherein the first measuring step includes the steps of:
measuring a secondary radiation radiated from the multilayer film of the optical element when the EUV light that is incident upon the optical element; and
finding a phase difference between the EUV light that is incident upon the multilayer film and the EUV light that has been reflected on the multilayer film based on a value of the secondary radiation that has been measured.

3. An adjusting method according to claim 1, wherein the first measuring step includes the steps of:
dividing the EUV light from a light source into plural rays using a first grating and irradiating the plural rays to plural positions on the multilayer film of the optical element;
uniting the plural rays that have been reflected at the plural positions using a second grating; and
finding a phase distribution of the EUV light if the EUV light is reflected on the optical element based on interference information obtained by measuring united light.

4. An adjusting method of an optical system that includes plural optical elements each having a multilayer film, said adjusting method comprising:
a finding step of finding a phase distribution of an EUV light if the EUV light passes the optical system, based on a difference between a phase distribution of the EUV light when the EUV light is reflected on the optical element and a phase distribution of a light with a wavelength that is longer than that of the EUV light when the light with the wavelength is reflected on the optical element, the difference being made for each optical element by measuring both the phase distribution of the EUV light and the phase distribution of the light having the wavelength, and a measurement result of a phase distribution of the light with the wavelength when the light with the wavelength passes the optical system; and
an adjusting step of adjusting at least one of a position and a posture of the optical element based on the phase distribution of the EUV light when the EUV light passes the optical system, which is found by the finding step.

5. An adjusting method according to claim 1, wherein the EUV light has a wavelength of 2 to 40 nm.

6. An adjusting method according to claim 1, wherein the wavelength the light is between 400 and 750 nm.

7. An exposure apparatus comprising a projection optical system configured to project a pattern of a reticle to an object to be exposed, the projection optical system including plural optical elements each having a multilayer film, and being adjusted by an adjusting method, wherein the adjusting method includes:
- a first measuring step of measuring, for each optical element, a phase distribution of an EUV light when the EUV light is reflected on the optical element, and a phase distribution of a light with a wavelength that is longer than that of the EUV light is when the light with the wavelength is reflected on the optical element;
- a first finding step of finding, for each optical element, a difference between the phase distribution of which an EUV light is reflected on the optical element and the phase distribution of which a light with a wavelength that is longer than the EUV light is reflected on the optical element;
- a second measuring step of measuring a phase distribution of the light with the wavelength when the light with the wavelength passes the optical system;
- a second finding step of finding a phase distribution of the EUV light if the EUV light passes the optical system based on the difference for each optical element found by the first finding step and the phase distribution measured by the second measuring step; and
- an adjusting step of adjusting at least one of a position and a posture of the optical element based on the phase distribution found by the second finding step.

8. A device fabrication method comprising the steps of:
exposing an object using an exposure apparatus; and
performing a development process for the object exposed, wherein the exposure apparatus includes a projection optical system configured to project a pattern of a reticle to the object to be exposed, the projection optical system including plural optical elements each having a multilayer film, and being adjusted by an adjusting method,
wherein the adjusting method includes:
- a first measuring step of measuring, for each optical element, a phase distribution of an EUV light when the EUV light is reflected on the optical element, and a phase distribution of a light with a wavelength that is longer than that of the EUV light when the light with the wavelength is reflected on the optical element;
- a first finding step of finding, for each optical element, a difference between the phase distribution of which an EUV light is reflected on the optical element and the phase distribution of which a light with a wavelength that is longer than the EUV light is reflected on the optical element;
- a second measuring step of measuring a phase distribution of the light with the wavelength when the light with the wavelength passes the optical system;
- a second finding step of finding a phase distribution of the EUV light if the EUV light passes the optical system based on the difference for each optical element found by the first finding step and the phase distribution measured by the second measuring step; and
- an adjusting step of adjusting at least one of a position and a posture of the optical element based on the phase distribution found by the second finding step.

9. An exposure apparatus comprising a projection optical system configured to project a pattern of a reticle to an object to be exposed, the projection optical system including plural optical elements each having a multilayer film, and being adjusted by an adjusting method,
wherein the adjusting method includes:
- a finding step of finding a phase distribution of an EUV light if the EUV light passes the optical system, based on a difference between a phase distribution of the EUV light when the EUV light is reflected on the optical element and a phase distribution of a light with a wavelength that is longer than that of the EUV light when the light with the wavelength is reflected on the optical element, the difference being made for each optical element by measuring both the phase distribution of the EUV light and the phase distribution of the light having the wavelength, and a measurement result of a phase distribution of the light with the wavelength when the light with the wavelength passes the optical system; and
- an adjusting step of adjusting at least one of a position and a posture of the optical element based on the phase distribution of the EUV light when the EUV light passes the optical system, which is found by the finding step.

10. A device fabrication method comprising the steps of:
exposing an object using an exposure apparatus; and
performing a development process for the object exposed,
wherein the exposure apparatus includes a projection optical system configured to project a pattern of a reticle to the object to be exposed, the projection optical system including plural optical elements each having a multilayer film, and being adjusted by an adjusting method,
wherein the adjusting method includes:
- a finding step of finding a phase distribution of an EUV light if the EUV light passes the optical system, based on a difference between a phase distribution of the EUV light when the EUV light is reflected on the optical element and a phase distribution of a light with a wavelength that is longer than that of the EUV light when the light with the wavelength is reflected on the optical element, difference being made for each optical element by measuring both the phase distribution of the EUV light and the phase distribution of the light having the wavelength, and a measurement result of a phase distribution of the light with the wavelength when the light with the wavelength passes the optical system; and
- an adjusting step of adjusting at least one of a position and a posture of the optical element based on the phase distribution of the EUV light when the EUV light passes the optical system, which is found by the finding step.

* * * * *